(12) United States Patent
Wang et al.

(10) Patent No.: US 11,894,308 B2
(45) Date of Patent: Feb. 6, 2024

(54) SEMICONDUCTOR PACKAGE AND METHOD OF MANUFACTURING THE SAME

(71) Applicant: Advanced Semiconductor Engineering, Inc., Kaohsiung (TW)

(72) Inventors: Sheng-Ming Wang, Kaohsiung (TW); Tien-Szu Chen, Kaohsiung (TW); Wen-Chih Shen, Kaohsiung (TW); Hsing-Wen Lee, Kaohsiung (TW); Hsiang-Ming Feng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 99 days.

(21) Appl. No.: 17/109,111

(22) Filed: Dec. 1, 2020

(65) Prior Publication Data

US 2021/0091006 A1    Mar. 25, 2021

Related U.S. Application Data

(63) Continuation of application No. 16/109,272, filed on Aug. 22, 2018, now Pat. No. 10,854,550.

(Continued)

(51) Int. Cl.
   *H01L 23/538*    (2006.01)
   *H01L 23/31*    (2006.01)
   (Continued)

(52) U.S. Cl.
   CPC ...... *H01L 23/5386* (2013.01); *H01L 21/4857* (2013.01); *H01L 21/6835* (2013.01);
   (Continued)

(58) Field of Classification Search
   CPC ............ H01L 21/486; H01L 23/49827; H01L 23/5386; H01L 23/49838; H01L 23/49844; H05K 2201/09563; H05K 2201/09854
   See application file for complete search history.

(56) References Cited

U.S. PATENT DOCUMENTS

| 7,994,634 B2 | 8/2011 | Kita et al. |
| 9,232,642 B2 | 1/2016 | Nakamura et al. |

(Continued)

FOREIGN PATENT DOCUMENTS

| CN | 1744791 A | 3/2006 |
| CN | 101546734 A | 9/2009 |

(Continued)

OTHER PUBLICATIONS

Non-Final Office Action for U.S. Appl. No. 16/109,272, dated Jul. 15, 2019, 17 pages.

(Continued)

*Primary Examiner* — John A Bodnar
(74) *Attorney, Agent, or Firm* — FOLEY & LARDNER LLP

(57) ABSTRACT

The present disclosure provides a semiconductor substrate, including a first dielectric layer with a first surface and a second surface, a first conductive via extending between the first surface and the second surface, a first patterned conductive layer on the first surface, and a second patterned conductive layer on the second surface. The first conductive via includes a bottom pattern on the first surface and a second patterned conductive layer on the second surface. The bottom pattern has at least two geometric centers corresponding to at least two geometric patterns, respectively, and a distance between one geometric center and an intersection of the two geometrical patterns is a geometric radius. A distance between the at least two geometric centers (Continued)

is greater than 1.4 times the geometric radius. A method for manufacturing the semiconductor substrate described herein and a semiconductor package structure having the semiconductor substrate are also provided.

14 Claims, 27 Drawing Sheets

Related U.S. Application Data

(60) Provisional application No. 62/564,939, filed on Sep. 28, 2017.

(51) Int. Cl.
  *H01L 21/48* (2006.01)
  *H01L 23/66* (2006.01)
  *H01L 23/367* (2006.01)
  *H01P 3/06* (2006.01)
  *H01L 21/683* (2006.01)
  *H01L 23/00* (2006.01)
  *H01L 25/065* (2023.01)

(52) U.S. Cl.
  CPC ...... *H01L 23/3107* (2013.01); *H01L 23/3677* (2013.01); *H01L 23/5383* (2013.01); *H01L 23/66* (2013.01); *H01P 3/06* (2013.01); *H01L 23/3128* (2013.01); *H01L 24/16* (2013.01); *H01L 24/48* (2013.01); *H01L 25/0657* (2013.01); *H01L 2221/68345* (2013.01); *H01L 2221/68359* (2013.01); *H01L 2223/6622* (2013.01); *H01L 2224/16225* (2013.01); *H01L 2224/32145* (2013.01); *H01L 2224/48225* (2013.01); *H01L 2224/73253* (2013.01); *H01L 2225/0651* (2013.01); *H01L 2225/06517* (2013.01); *H01L 2225/06558* (2013.01); *H01L 2924/15313* (2013.01); *H01L 2924/19041* (2013.01); *H01L 2924/19042* (2013.01); *H01L 2924/19043* (2013.01); *H01L 2924/19103* (2013.01); *H01L 2924/19105* (2013.01)

(56) References Cited

U.S. PATENT DOCUMENTS

| | | | |
|---|---|---|---|
| 2004/0150095 A1 | 8/2004 | Fraley et al. | |
| 2006/0046464 A1 | 3/2006 | Miura et al. | |
| 2006/0083895 A1* | 4/2006 | Ikeda | B32B 3/10 |
| | | | 257/E23.079 |
| 2006/0099801 A1* | 5/2006 | Cranmer | H05K 1/115 |
| | | | 257/E21.597 |
| 2009/0294951 A1* | 12/2009 | Murai | H01L 24/24 |
| | | | 257/E23.116 |
| 2011/0129999 A1 | 6/2011 | Nukaga et al. | |
| 2011/0201197 A1 | 8/2011 | Nilsson et al. | |
| 2011/0273855 A1* | 11/2011 | Kim | H05K 1/115 |
| | | | 174/266 |
| 2014/0041923 A1* | 2/2014 | Hisada | H05K 1/115 |
| | | | 174/266 |
| 2015/0084051 A1* | 3/2015 | Kubo | H05K 1/181 |
| | | | 438/15 |
| 2015/0096791 A1* | 4/2015 | Katsube | H05K 3/4629 |
| | | | 174/255 |
| 2016/0234932 A1 | 8/2016 | Oshima et al. | |
| 2016/0240467 A1* | 8/2016 | Yoshida | H01L 23/49811 |

FOREIGN PATENT DOCUMENTS

| | | |
|---|---|---|
| CN | 102113100 A | 6/2011 |
| CN | 102246299 A | 11/2011 |

OTHER PUBLICATIONS

Final Office Action for U.S. Appl. No. 16/109,272, dated Jan. 7, 2020, 17 pages.
Notice of Allowance for U.S. Appl. No. 16/109,272, dated Jul. 29, 2020, 8 pages.
Office Action for corresponding Chinese Patent Application No. 201811107041.5, dated Sep. 2, 2021, 9 pages.
Search Report (with English translation) for corresponding Chinese Patent Application No. 201811107041.5, dated Sep. 2, 2021, 4 pages.
Search Report with English Translation for corresponding Chinese Patent Application No. 201811107041.5, dated Nov. 16, 2022, 4 pages.
Notification to Grant for corresponding Chinese Patent Application No. 201811107041.5, dated Nov. 16, 2022, 4 pages.

* cited by examiner

SEMICONDUCTOR PACKAGE AND METHOD OF MANUFACTURING THE SAME

CROSS-REFERENCE TO RELATED APPLICATION

This application is a continuation of U.S. patent application Ser. No. 16/109,272 filed Aug. 22, 2018, which claims the benefit of and priority to U.S. Provisional Application No. 62/564,939, filed Sep. 28, 2017, the contents of which are incorporated herein by reference in their entirety.

BACKGROUND

Heat dissipation is important to semiconductor devices with high processing speeds, and those that deal with very large quantities of data or operate in high-temperature environments. Such semiconductor devices may include but are not limited to, for example, central processing unit (CPU), graphics processing unit (GPU), field-programmable gate array (FPGA), application-specific integrated circuit (ASIC), power management integrated circuit (PMIC), optical IC, optical emitter, optical sensor or the like. The above-mentioned semiconductor devices may be used in applications specifying very high processing power, such as bitcoin or other blockchain applications, or artificial intelligence (AI) applications.

SUMMARY

Some embodiments of the present disclosure provide a semiconductor substrate, including a first dielectric layer, having a first surface and a second surface opposite to the first surface, a first conductive via extending between the first surface and the second surface, a first patterned conductive layer on the first surface, and a second patterned conductive layer on the second surface. The first conductive via includes a bottom pattern at the first surface and a second patterned conductive layer on the second surface. The bottom pattern has at least two geometric centers corresponding to at least two geometric patterns, respectively, and a distance between one geometric center and an intersection of the two geometrical patterns is a geometric radius. A distance between the at least two geometric centers is greater than 1.4 times the geometric radius.

Some embodiments of the present disclosure provide a semiconductor package structure, including a semiconductor substrate described herein, a semiconductor die over the first surface of the first dielectric layer and electrically coupled to the first patterned conductive layer, and an encapsulant covering the semiconductor substrate and the semiconductor die.

Some embodiments of the present disclosure provide a method for manufacturing a semiconductor substrate, including providing a dielectric layer, removing a first portion of the dielectric layer to form a first predetermined via hole, a second predetermined via hole partially overlapping the first predetermined via hole, a third predetermined via hole partially overlapping the second predetermined via hole, and a fourth predetermined via hole partially overlapping the third predetermined via hole and the first predetermined via hole, wherein each of the first, second, third, and fourth predetermined via holes comprises a top opening and a bottom opening smaller than the top opening; and removing a second portion of the dielectric layer to form a fifth predetermined via hole. Bottom openings of the first, second, third, and fourth predetermined via holes surround a residual region. The fifth predetermined via hole completely covers the residual region.

BRIEF DESCRIPTION OF THE DRAWINGS

Aspects of the present disclosure are best understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
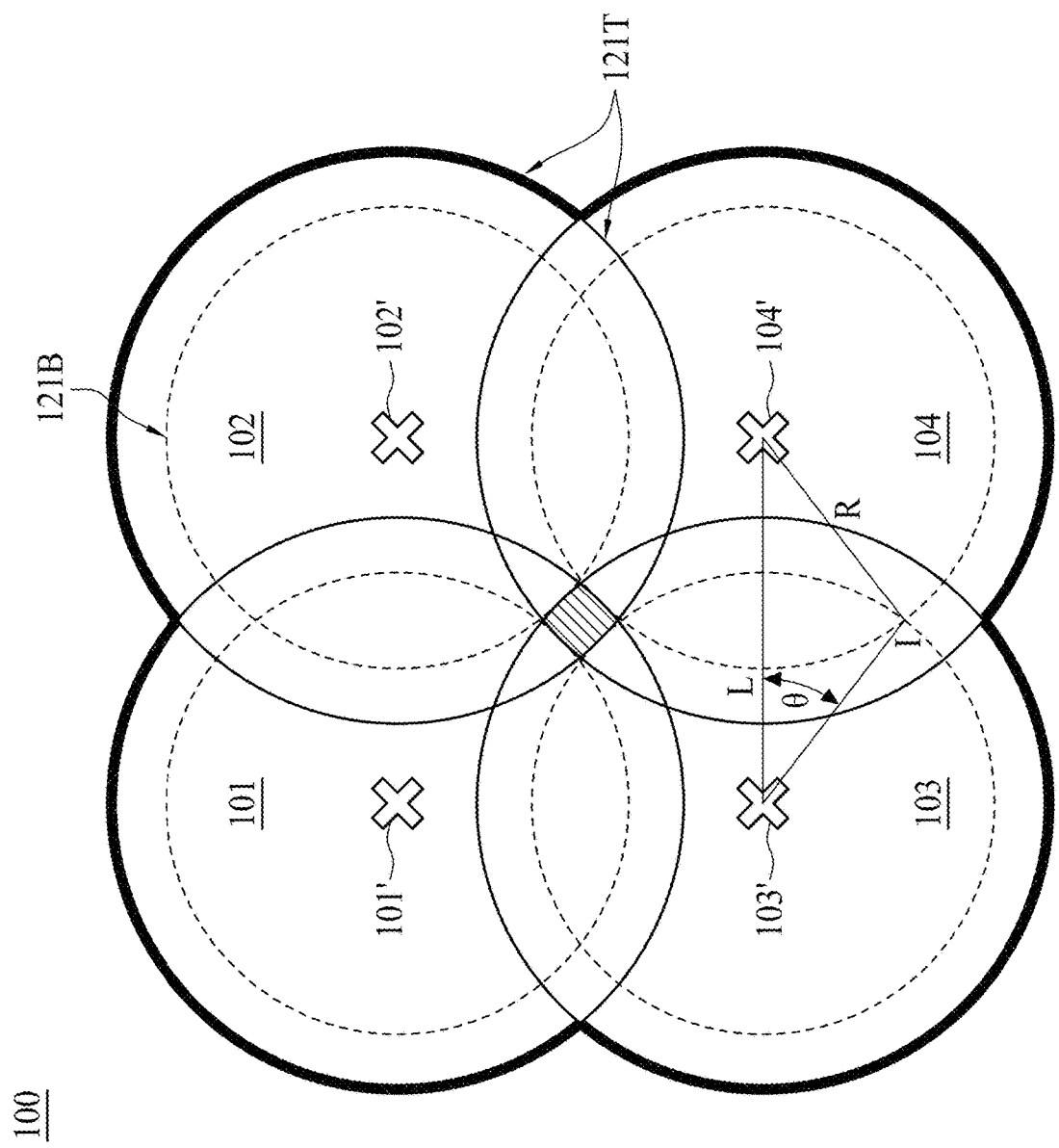
FIG. 1 is a top view of a conductive via having a top pattern in solid lines and a bottom pattern in dotted lines.

The following disclosure provides many different embodiments, or examples, for implementing different features of the provided subject matter. Specific examples of components and arrangements are described below to simplify the present disclosure. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The numerical ranges and parameters setting forth the broad scope of the disclosure may be approximations, and the numerical values set forth in the specific examples may be reported as precisely as possible. Some numerical values, however, may contain certain errors resulting from the standard deviation found in the respective testing measurements. Also, as used herein, the term "about" generally means within ±10%, ±5%, ±1%, or ±0.5% of a given value or range. Other than in the operating/working examples, or unless otherwise expressly specified, numerical ranges, amounts, values and percentages such as those for quantities of materials, durations of times, temperatures, operating conditions, ratios of amounts, and the likes thereof disclosed herein may be modified in such instances by the term "about." Accordingly, unless indicated to the contrary, the numerical parameters set forth in the present disclosure and attached claims may be approximations that can vary. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

In some embodiments, via structures connecting interconnect metal lines in adjacent layers have diameters of from about 50 μm to 90 μm. The diameter of via structures affects the series resistance and the heat dissipation rate of an interconnect. In high power applications ICs, reducing series resistance and raise heat dissipation rate are desired in order to achieve better device performance, and hence, increasing the diameter of the via structures and utilizing compatible process and apparatus of current technology is introduced.

FIG. 1 is a top view of a conductive via 100 having a top pattern 121T in solid lines and a bottom pattern 121B in dotted lines. A contour of the top pattern 121T is illustrated in bold solid lines. In some embodiments, the top pattern 121T of the conductive via 100 can be composed of four geometric circles 101, 102, 103, and 104, shown in solid lines, where the circle 101 is partially overlapped with the circle 102, the circle 102 is partially overlapped with the circle 104, the circle 104 is partially overlapped with the circle 103, and the circle 103 is partially overlapped with the circle 101. Each of the circles 101, 102, 103, and 104 of the top pattern 121T has a geometric center 101', 102', 103', and 104', respectively. It can be observed that the four geometric circles 101, 102, 103, and 104 are mutually overlapped at a shaded center of the contour of the top pattern 121T.

The bottom pattern 121B of the conductive via 100 can be composed of four geometric circles 101, 102, 103, and 104, shown in dotted lines, where the circle 101 is partially overlapped with the circle 102, the circle 102 is partially overlapped with the circle 104, the circle 104 is partially overlapped with the circle 103, and the circle 103 is partially overlapped with the circle 101. In other words, the circles 101, 102, 103, and 104 of the bottom pattern 121B are concentric with the circles 101, 102, 103, and 104 of the top pattern 121T. Each of the circles 101, 102, 103, and 104 of the bottom pattern 121B has a geometric center 101', 102', 103', and 104', respectively. It can be observed that the four geometric circles 101, 102, 103, and 104 are not mutually overlapped at a center of the contour of the bottom pattern 121B.

As shown in the bottom pattern 121B, a distance L between two geometric centers 103' and 104' is measured through a straight line. Each of the two geometric centers 103' and 104' has a geometric radius with a distance R between respective geometric center and an intersection I of the adjacent geometric circles 103 and 104. An included angle θ is formed between the connection line measuring the distance L and the geometric radius with the distance R. In some embodiments, the included angle θ functions as a calibration of the separation between the two adjacent geometric patterns 103 and 104 of the bottom pattern 121B. For example, when the two geometric patterns 103 and 104 are farther apart, the included angle θ is smaller; whereas when the two geometric patterns 103 and 104 are closer together, the included angle θ is larger. In some embodiments, the separation between the two adjacent geometric patterns 103 and 104 in FIG. 1 can be defined by having an included angle θ smaller than 45 degrees. When the included angle θ is smaller than 45 degrees, the separation between two adjacent geometric patterns 103 and 104, or 101 and 103, or 101 and 102, or 102 and 104, is great enough to form a non-overlapping region at a center of the contour of the bottom pattern 121B. In some embodiments, the geometric radius R is less than 45 μm.

Referring to FIG. 1, the distance L can be calculated as 2*R*cos(θ). When the included angle θ is smaller than 45 degrees, the distance L is greater than about 1.4 times the geometric radius R.

Figure 2B:
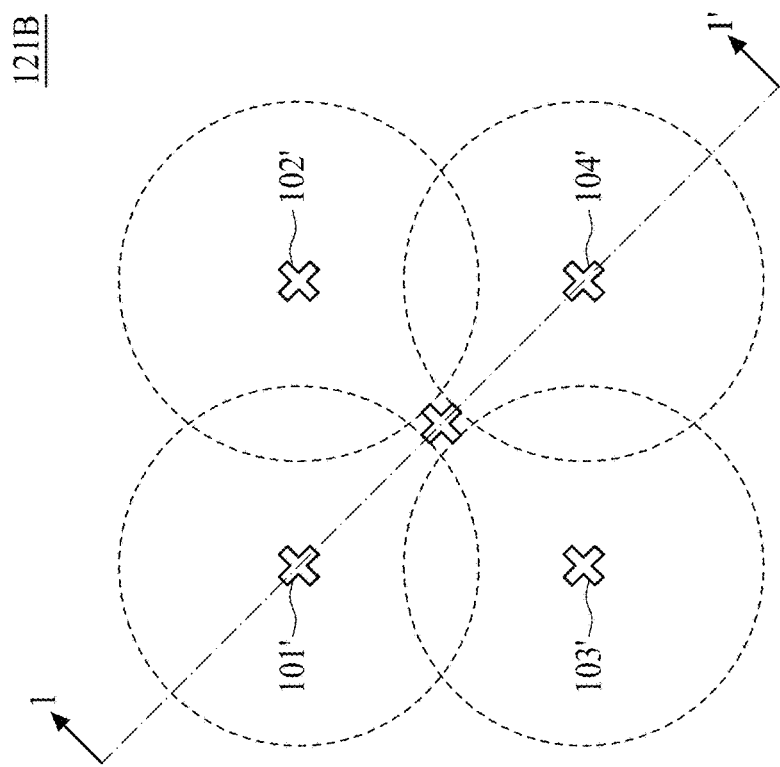
FIG. 2B is a bottom pattern of the conductive via in FIG. 2A.
Figure 2A:
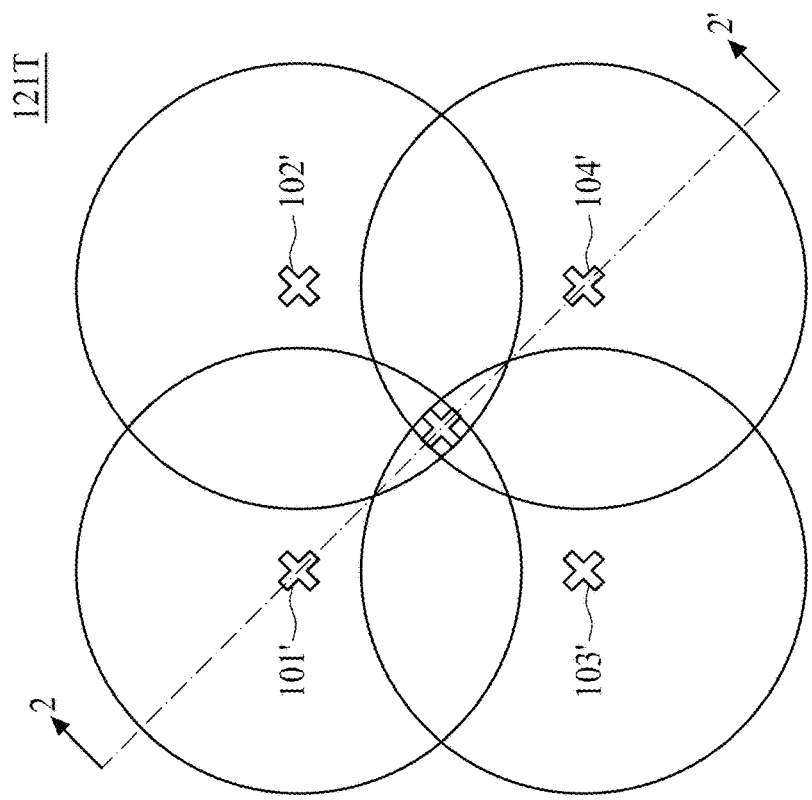
FIG. 2A is a top pattern of a conductive via.

FIG. 2A is a top pattern 121T of a conductive via 100 in FIG. 1. FIG. 2B is a bottom pattern 121B of the conductive via 100 in FIG. 1. As previously described, the top pattern 121T has a mutually overlapped region at the center of the top pattern contour, whereas the bottom pattern does not have any overlapped region at the center of the bottom pattern contour. Dissection lines 22' and 11' are illustrated in FIG. 2A and FIG. 2B, respectively, by diagonally passing the contour of top pattern 121T and the bottom pattern 121B. Note that the dissection lines 22' and 11' both pass the centers of the contour of top pattern 121T and the bottom pattern 121B.

Figure 3:
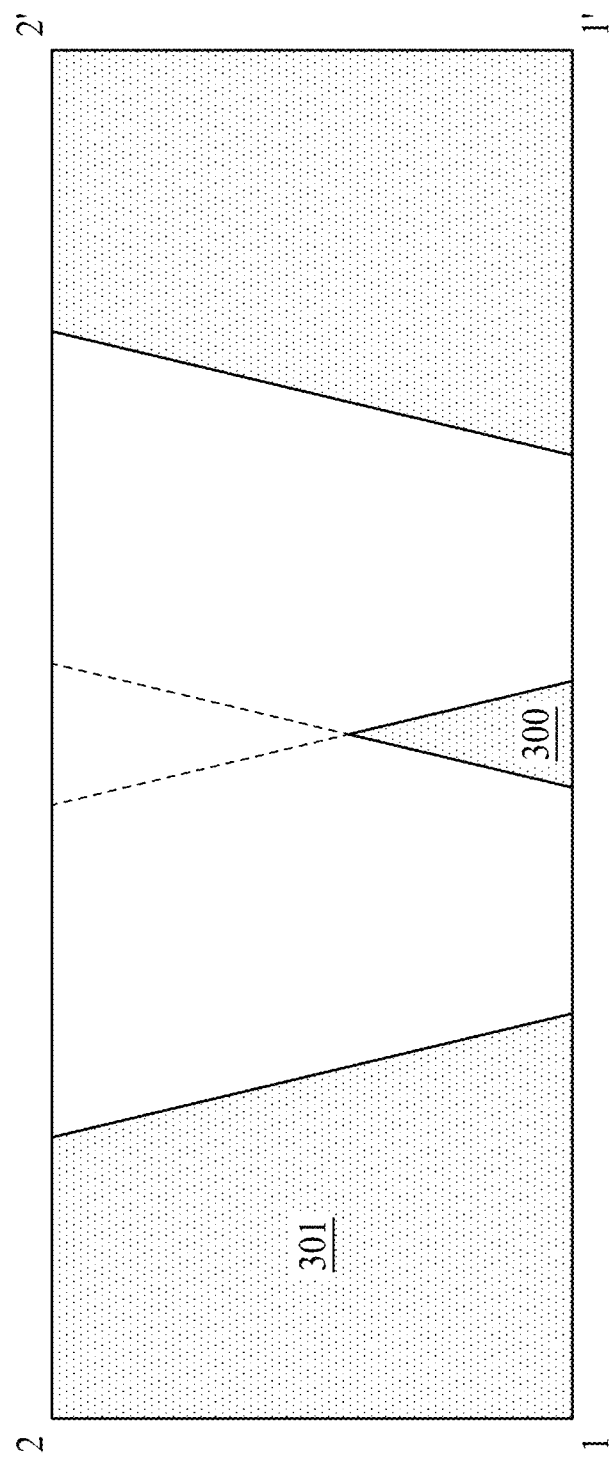
FIG. 3 is a cross-sectional view of the conductive via in FIG. 2A and FIG. 2B.

FIG. 3 is a cross-sectional view of the conductive via 100 in FIG. 1, FIG. 2A and FIG. 2B. In some embodiments, the conductive via 100 is surrounded by a dielectric layer 301. The dissection line 22' across the top pattern 121T is at a top surface of the dielectric layer 301. The dissection line 11' across the bottom pattern 121B is at a bottom surface of the dielectric layer 301. Since the top pattern 121T has an overlapping region at the center of the contour, no dielectric residue can be observed at the top surface of the dielectric layer 301. In contrast, since the bottom pattern 121B does not have an overlapping region at the center of the contour, dielectric residue 300 can be observed at the bottom surface of the dielectric layer 301. In some embodiments, cross sections between the top pattern 121T and the bottom pattern 121B have a tapered shape. In some embodiments, a via trench in the dielectric layer 301 is formed by laser grooving operations, and subsequently, the via trench is filled with conductive materials.

As shown in FIG. 3, since the dielectric residue 300 occupies a portion of the via trench, after the conductive materials are filled, the resulting series resistance is higher and the heat dissipation rate of the conductive via is lower than a conductive via where no dielectric residue is present.

Figure 4A:
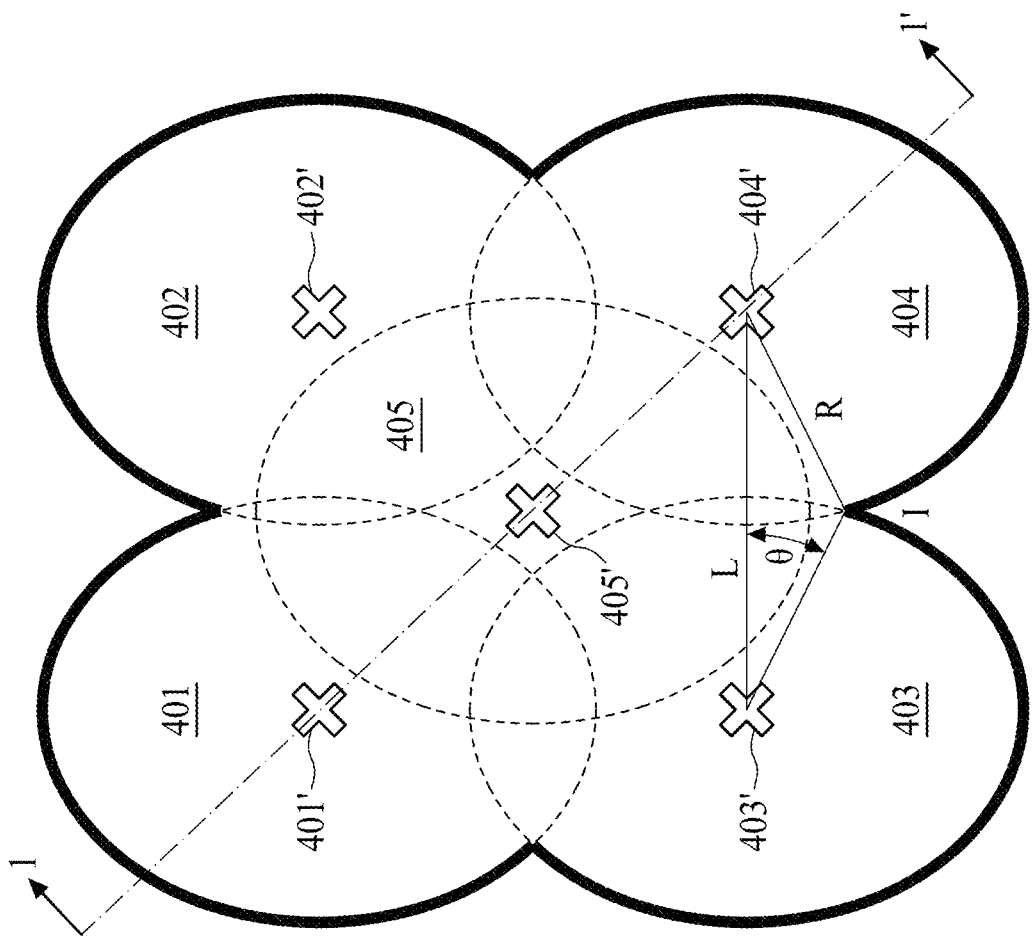
FIG. 4A is a bottom pattern of a conductive via, in accordance with some embodiments of the present disclosure.

FIG. 4A is a bottom pattern of a conductive via, in accordance with some embodiments of the present disclosure. The bottom pattern of the conductive via can be composed of five geometric patterns 401, 402, 403, 404, and 405, shown in dotted lines, where the pattern 401 is partially overlapped with the pattern 402, the pattern 402 is partially overlapped with the pattern 404, pattern 404 is partially overlapped with the pattern 403, pattern 403 is partially overlapped with the pattern 401, and pattern 405 is partially overlapped with the patterns 401, 402, 403, and 404. Each of the patterns 401, 402, 403, 404, and 405 has a geometric center 401', 402', 403', 404' and 405', respectively. It can be observed that the four geometric patterns 401, 402, 403, and 404 are not mutually overlapped at a center of the contour of the bottom pattern, but the center of the contour is covered by the fifth geometric pattern 405. In some embodiments, the bottom pattern in FIG. 4A includes a plurality of ellipses arranged in a 2×2 matrix. In addition, a fifth ellipse is positioned at a location covering the center of the plurality of ellipses.

In some embodiments, the geometric patterns 401, 402, 403, 404 are each composed of an ellipse. As shown in FIG. 4A, the bottom pattern contour is marked with bold lines. The bottom pattern contour can be composed of, for example, four curves, wherein each curve can be a portion of an ellipse. A distance L between two geometric centers 403' and 404' is measured through a straight line. Each of the two geometric centers 403' and 404' has a geometric radius with a distance R between a respective geometric center and an intersection I of the adjacent geometric patterns 403 and 404. An included angle θ is formed between the connection line measuring the distance L and the geometric radius with the distance R. In some embodiments, the included angle θ functions as a calibration of the separation between the two adjacent geometric patterns 403 and 404 of the bottom pattern. In some embodiments, the separation between the two adjacent geometric patterns 403 and 404 in FIG. 4A can be defined by having an included angle θ smaller than 45 degrees. When the included angle θ is smaller than 45 degrees, the separation between two adjacent geometric patterns 403 and 404, or 401 and 403, or 401 and 402, or 402 and 404, is great enough to form a non-overlapping region at a center of the contour of the bottom pattern. In contrast to the bottom pattern shown in FIG. 2B, the non-overlapping region at a center of the contour of the bottom pattern in FIG. 4A is covered by a fifth geometric pattern 405. In some embodiments, the geometric radius R is less than 45 μm.

Figure 4B:
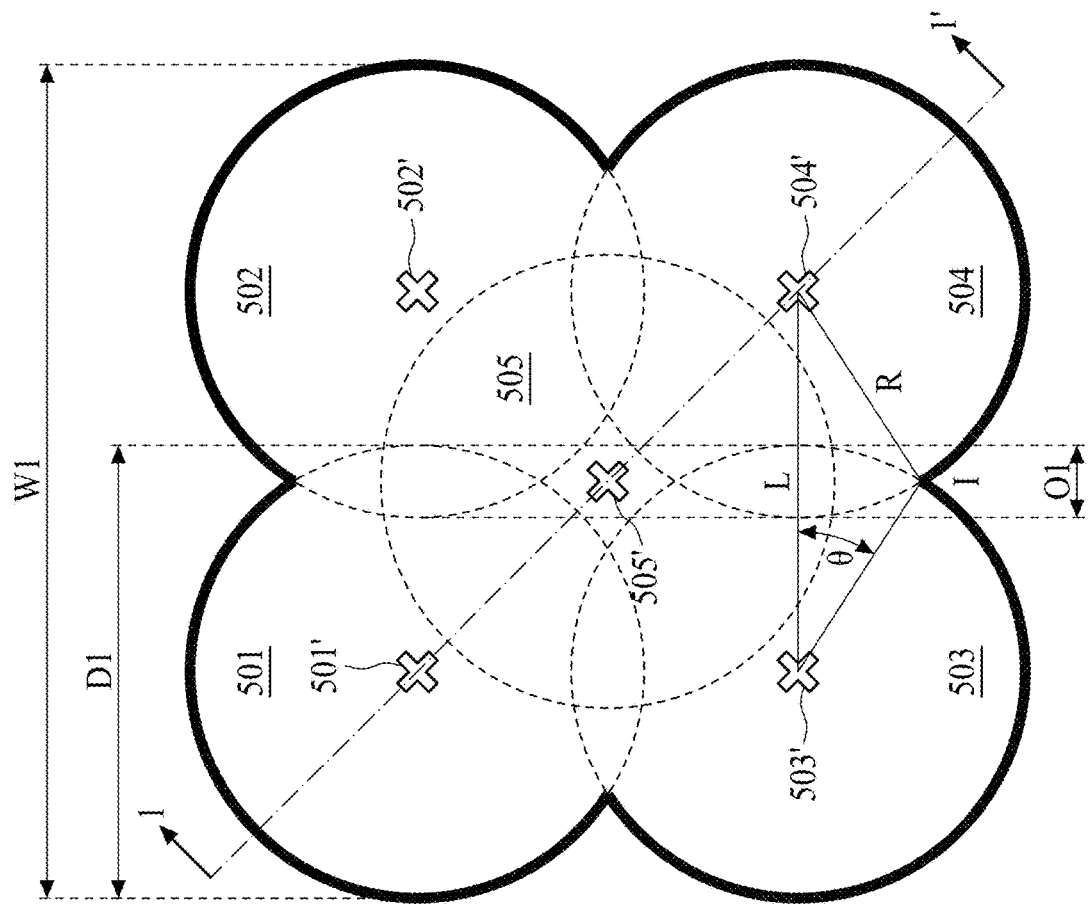
FIG. 4B is a bottom pattern of a conductive via, in accordance with some embodiments of the present disclosure.

FIG. 4B is a bottom pattern of a conductive via, in accordance with some embodiments of the present disclosure. The bottom pattern of the conductive via can be composed of five geometric patterns 501, 502, 503, 504, and 505, shown in dotted lines, where the pattern 501 is partially overlapped with the pattern 502, the pattern 502 is partially overlapped with the pattern 504, pattern 504 is partially overlapped with the pattern 503, pattern 503 is partially overlapped with the pattern 501, and pattern 505 is partially overlapped with the patterns 501, 502, 503, and 504. Each of the patterns 501, 502, 503, 504, and 505 has a geometric center 501', 502', 503', 504' and 505', respectively. It can be observed that the four geometric patterns 501, 502, 503, and 504 are not mutually overlapped at a center of the contour of the bottom pattern, but the center of the contour is covered by the fifth geometric pattern 505. In some embodiments, the bottom pattern in FIG. 4B includes a plurality of substantial circles arranged in a 2×2 matrix. In addition, a fifth substantial circle is positioned at a location covering the center of the plurality of substantial circles.

In some embodiments, the geometric patterns 501, 502, 503, 504 are composed of four circles. The bottom pattern contour is marked with bold lines. The bottom pattern contour can be composed of, for example, four curves, and each curve can be a portion of a circle. In other words, each of the geometric centers 501', 502', 503', and 504' is a center of curvature to corresponding curves. For example, the bolded curve of geometric pattern 501 has a center of curvature at the geometric center 501', and the bolded curve of geometric pattern 502 has a center of curvature at the geometric center 502', and so on. If the geometric patterns 501, 502, 503, 504 are composed of four circles, each circle's diameter can be measured. In some embodiments, a diameter D1 of the geometric pattern 501 is about 90 μm. An overlapping width O1 between adjacent geometric patterns 503 and 504 is about 10 μm. A total width W1 of the bottom pattern contour can be at least about 170 μm.

A distance L between two geometric centers 503' and 504' is measured through a straight line. Each of the two geometric centers 503' and 504' has a geometric radius with a distance R between a respective geometric center and an intersection I of the adjacent geometric patterns 503 and 504. An included angle θ is formed between the connection line measuring the distance L and the geometric radius with the distance R. In some embodiments, the included angle θ functions as a calibration of the separation between the two adjacent geometric patterns 503 and 504 of the bottom pattern. In some embodiments, the separation between the two adjacent geometric patterns 503 and 504 in FIG. 4B can be defined by having an included angle θ smaller than 45 degrees. When the included angle θ is smaller than 45 degrees, the separation between two adjacent geometric patterns 503 and 504, or 501 and 503, or 501 and 502, or 502 and 504, is great enough to form a non-overlapping region at a center of the contour of the bottom pattern. Unlike the bottom pattern shown in FIG. 2B, the non-overlapping region at a center of the contour of the bottom pattern in FIG. 4B is covered by a fifth geometric pattern 505. In some embodiments, the geometric radius R is less than 45 µm.

Figure 4C:
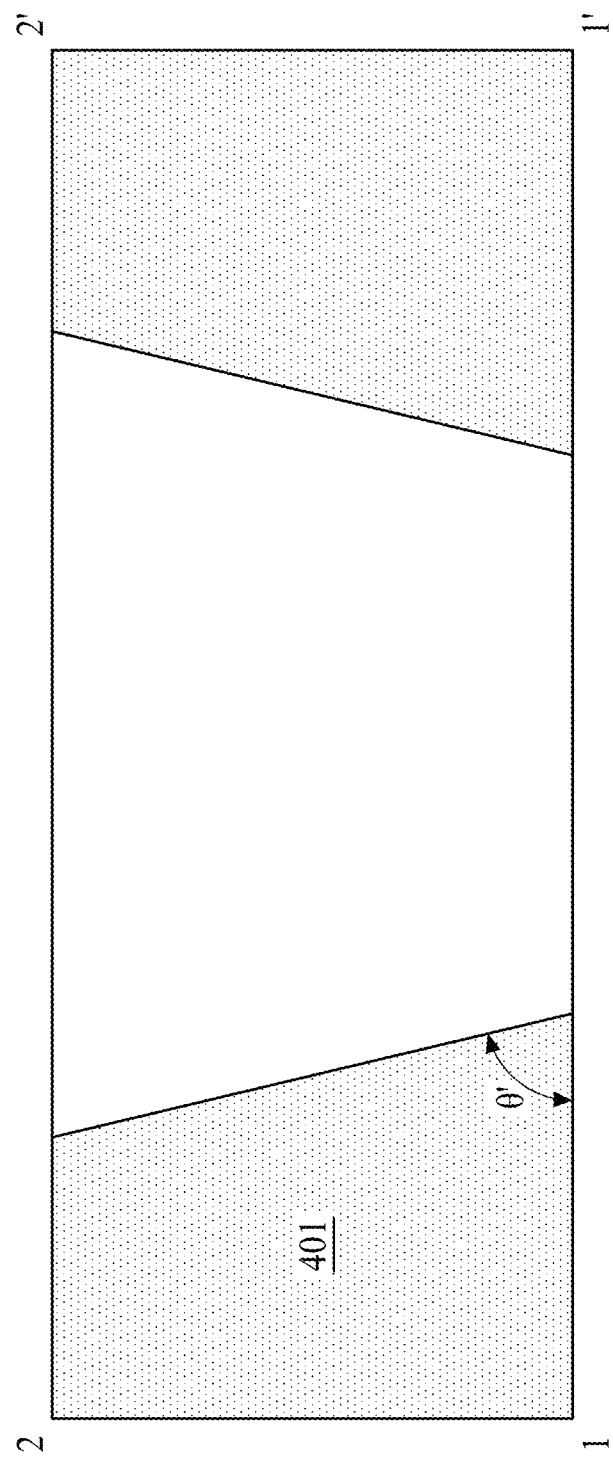
FIG. 4C is a cross-sectional view of a conductive via, in accordance with some embodiments of the present disclosure.

FIG. 4C is a cross-sectional view of a conductive via in FIG. 4A and FIG. 4B, in accordance with some embodiments of the present disclosure. In some embodiments, the conductive via is surrounded by a dielectric layer 401. The dissection line 22' is at a top surface of the dielectric layer 401. The dissection line 11' across the bottom pattern is at a bottom surface of the dielectric layer 401. As described above, since the top pattern has an overlapping region at the center of the contour, no dielectric residue can be observed at the top surface of the dielectric layer 401. In contrast, since the bottom pattern in FIG. 4A and FIG. 4B also has a fifth pattern overlapping at the center of the contour, no dielectric residue can be observed at the bottom surface of the dielectric layer 401. In some embodiments, cross sections between the top pattern and the bottom pattern have a tapered shape with an included angle $\theta'$ of 85 degrees. In some embodiments, a via trench in the dielectric layer 401 is formed by laser grooving operations, and subsequently, the via trench is filled with conductive materials.

As shown in FIG. 4C, since no dielectric residue occupies a portion of the via trench. After the conductive material is filled, the resulting series resistance is lower and the heat dissipation rate of the conductive via is greater than a conductive via where dielectric residue is present.

Figure 5A:
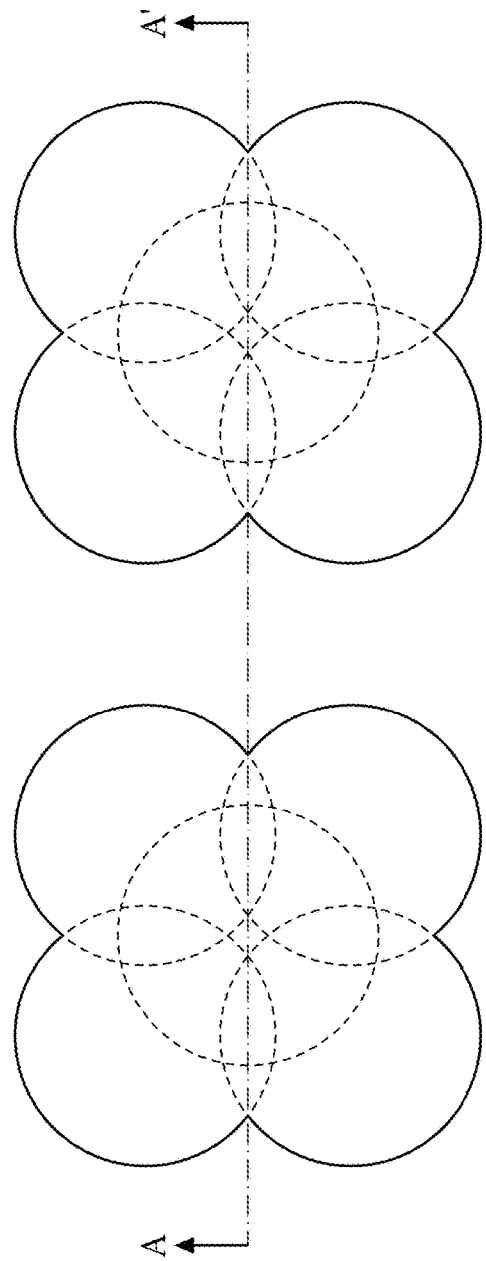
FIG. 5A is a pattern of a conductive via, in accordance with some embodiments of the present disclosure.
Figure 5B:
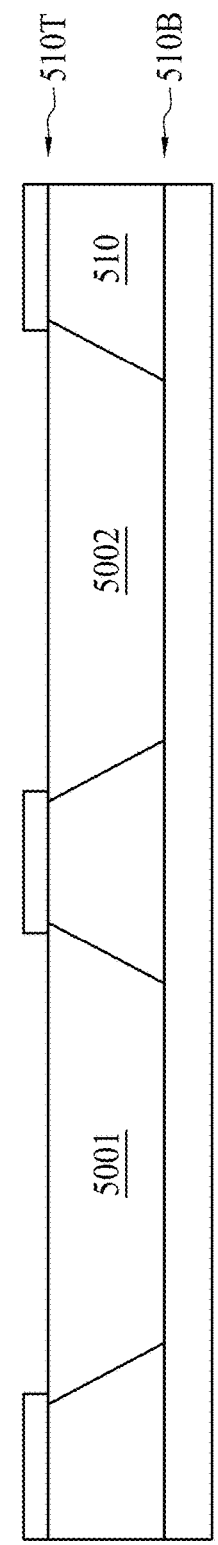
FIG. 5B is a cross-sectional view of the conductive via across line AA' in FIG. 5A.

Referring to FIG. 5A and FIG. 5B, FIG. 5A is a bottom pattern of a conductive via, and FIG. 5B is a cross-sectional view of the conductive via across line AA' in FIG. 5A, in accordance with some embodiments of the present disclosure. FIG. 5A shows two adjacent conductive vias having a plurality of curves illustrated by solid lines. Each of the conductive vias may be formed by a number (e.g., five) of overlapping geometric patterns. In FIG. 5B, the two conductive vias 5001 and 5002 are disposed in a dielectric layer 510. The dielectric layer 510 includes a first surface or a top surface 510T and a second surface or a bottom surface 510B opposite to the top surface 510T. The two conductive vias 5001 and 5002 extend between the top surface 510T and the bottom surface 510B. Each of the two conductive vias 5001 and 5002 has a top pattern at the top surface 510T and a bottom pattern at the bottom surface 510B. FIG. 5A is a bottom pattern at the bottom surface 510B. Details of the bottom pattern can be found by referring to the details shown in FIG. 4A and FIG. 4B, and are not repeated here for brevity.

Figure 6A:
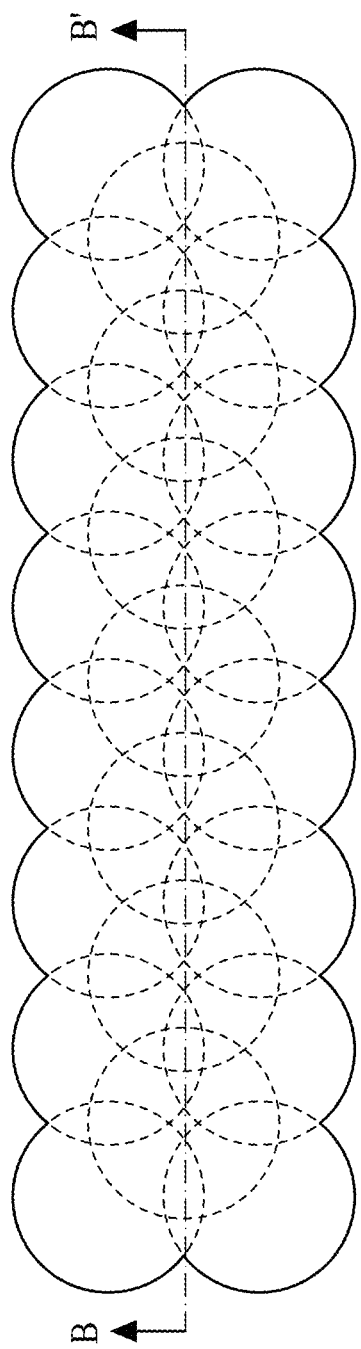
FIG. 6A is a pattern of a conductive via, in accordance with some embodiments of the present disclosure.
Figure 6B:
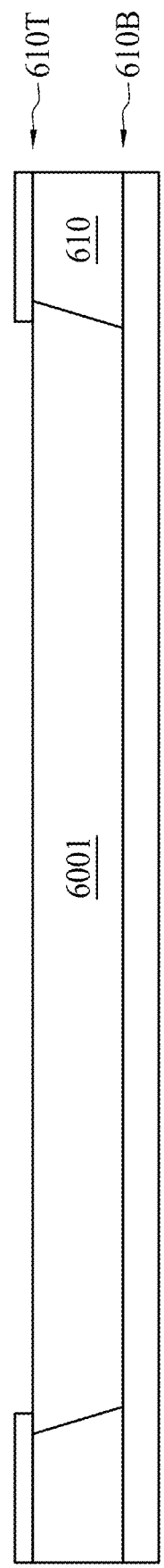
FIG. 6B is a cross-sectional view of the conductive via across line BB' in FIG. 6A.

Referring to FIG. 6A and FIG. 6B, FIG. 6A is a bottom pattern of a conductive via, and FIG. 6B is a cross-sectional view of the conductive via across line BB' in FIG. 6A, in accordance with some embodiments of the present disclosure. FIG. 6A shows an extended conductive via having a plurality of curves illustrated by solid lines. The extended conductive via is arranged to extend along a principal direction, for example the transversal direction. The extended conductive via may be formed by a number (e.g., 23) of overlapping geometric patterns. In FIG. 6B, the extended conductive via 6001, or a trench conductive via, is disposed in a dielectric layer 610. The dielectric layer 610 includes a first surface or a top surface 610T and a second surface or a bottom surface 610B opposite to the top surface 610T. The extended conductive via 6001 extends between the top surface 610T and the bottom surface 610B. The extended conductive via 6001 has a top pattern at the top surface 610T and a bottom pattern at the bottom surface 610B. FIG. 6A is a bottom pattern at the bottom surface 610B. The bottom pattern of FIG. 6A can be a repeat construction of patterns described in FIG. 4A and FIG. 4B. In some embodiments, the bottom pattern in FIG. 6A includes a plurality of substantial circles arranged in an 8×2 matrix. In addition, seven substantial circles are positioned at a location covering the center of each 2×2 substantial circle units.

Figure 7:
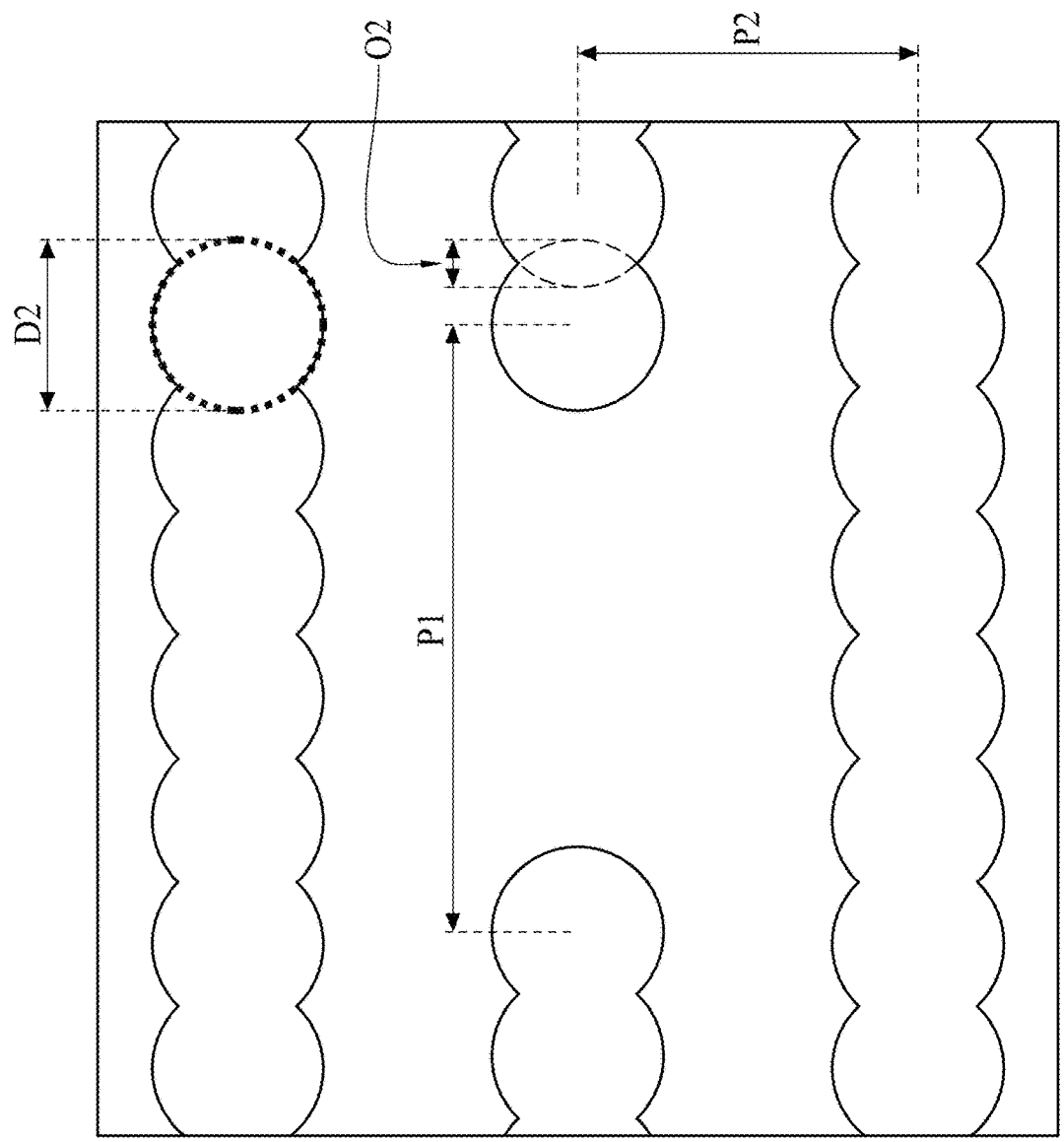
FIG. 7 is a top view of a plurality of conductive vias, in accordance with some embodiments of the present disclosure.

Referring to FIG. 7, FIG. 7 is a top view of a plurality of conductive vias, in accordance with some embodiments of the present disclosure. The pattern includes four conductive vias, including one on top, two in the middle and one at the bottom. Each of the conductive vias has a plurality of curves. Each of the conductive vias has a conductive wall structure. Each of the conductive vias is formed by filling conductive material in a trench defined by a dielectric or insulation material. Each of the four conductive vias can be composed of a series of via units. For example, the top conductive via includes at least 8 via units, and each of the via units has a via size D2 of from about 50 µm to 90 µm. In some embodiments, a transversal length of the top conductive via can be about 1.5 mm to 1.8 mm. In FIG. 7, a circular pattern constitutes a via unit. In some embodiments, a pitch P1 between the middle left conductive via and the middle right conductive via is approximately 0.3 mm (or 300 µm). In some embodiments, a pitch P2 between middle right conductive via and bottom conductive via is approximately 0.17 mm (or 170 µm). An overlapped width O2 of the two consecutive via units has a maximum width of approximately 0.0617 mm (or 61.7 µm). It should be noted that shape or contour of each of the conductive vias can be varied according to interest.

Figure 8:
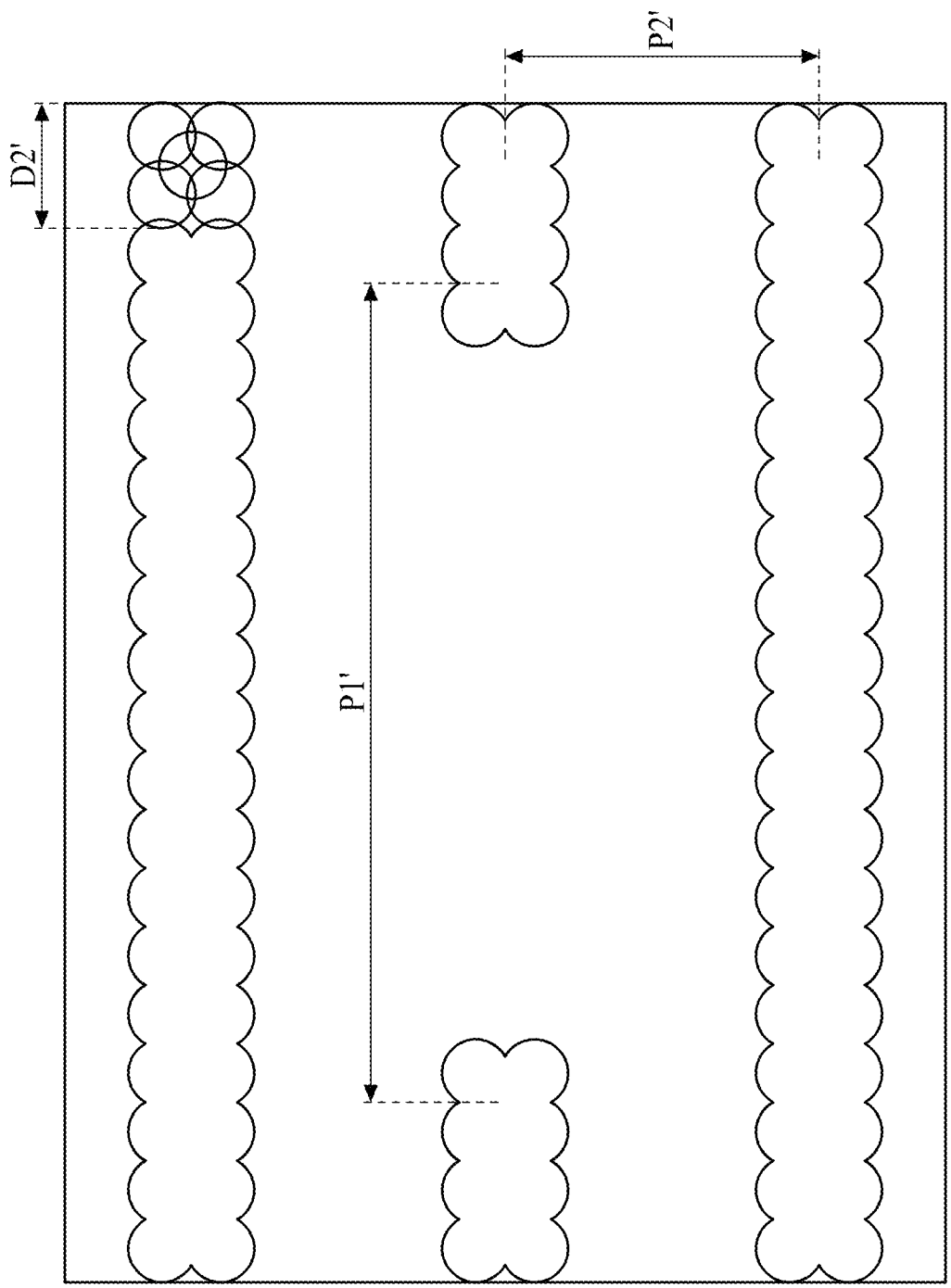
FIG. 8 is a top view of a plurality of conductive vias, in accordance with some embodiments of the present disclosure.

Referring to FIG. 8, FIG. 8 is a top view of a plurality of conductive vias, in accordance with some embodiments of the present disclosure. The pattern includes four conductive vias, including one on top, two in the middle and one at the bottom. Each of the conductive vias has a plurality of curves. Each of the conductive vias has a conductive wall structure. Each of the conductive vias is formed by filling conductive material in a trench defined by a dielectric or insulation material. Each of the four conductive vias can be composed of a series of via units. In FIG. 8, five partially overlapping circular patterns constitute a via unit. For example, the top conductive via includes at least 10 via units, and each unit has a via size D2' of from about 150 µm to 190 µm. In some embodiments, a pitch P1' between a middle left conductive via and a middle right conductive via is approximately 0.326 mm (or 326 µm). In some embodiments, a pitch P2' between the middle right conductive via and the bottom conductive via is approximately 0.3 mm (or 300 µm). It should be noted that the shape or contour of each of the conductive vias can be varied according to interest.

Figure 9:
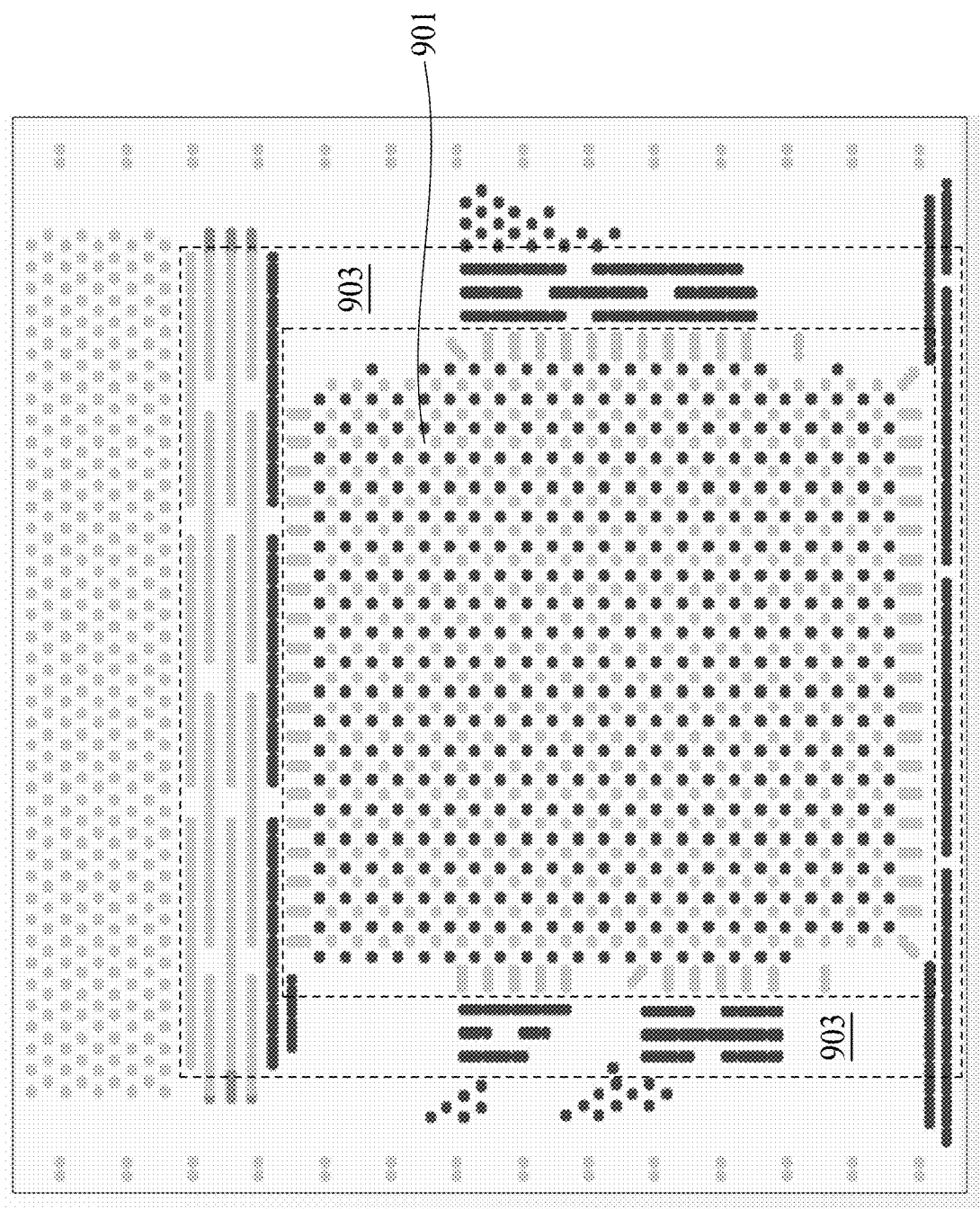
FIG. 9 is a top view of a semiconductor package having a plurality of conductive vias, in accordance with some embodiments of the present disclosure.

Referring to FIG. 9, FIG. 9 is a top view of a semiconductor package having a plurality of conductive vias, in accordance with some embodiments of the present disclosure. The conductive via layout shown in FIG. 9 has a die region 901 and a peripheral region 903. In some embodiments, separate via units are located at the die region 901, whereas conductive vias composed of a plurality of overlapping via units are located at the peripheral region 903. Note the via units can be those described in FIG. 7 or FIG. 8. In some embodiments, conductive vias in the die region 901 include ground connections and/or power I/O connections. In some embodiments, conductive vias in the peripheral region 903 include power I/O connections. However, types of connections utilizing the conductive via structure disclosed herein are not limited thereto. Any type of connections can utilize the conductive via disclosed to meet the specified application.

Figure 10:
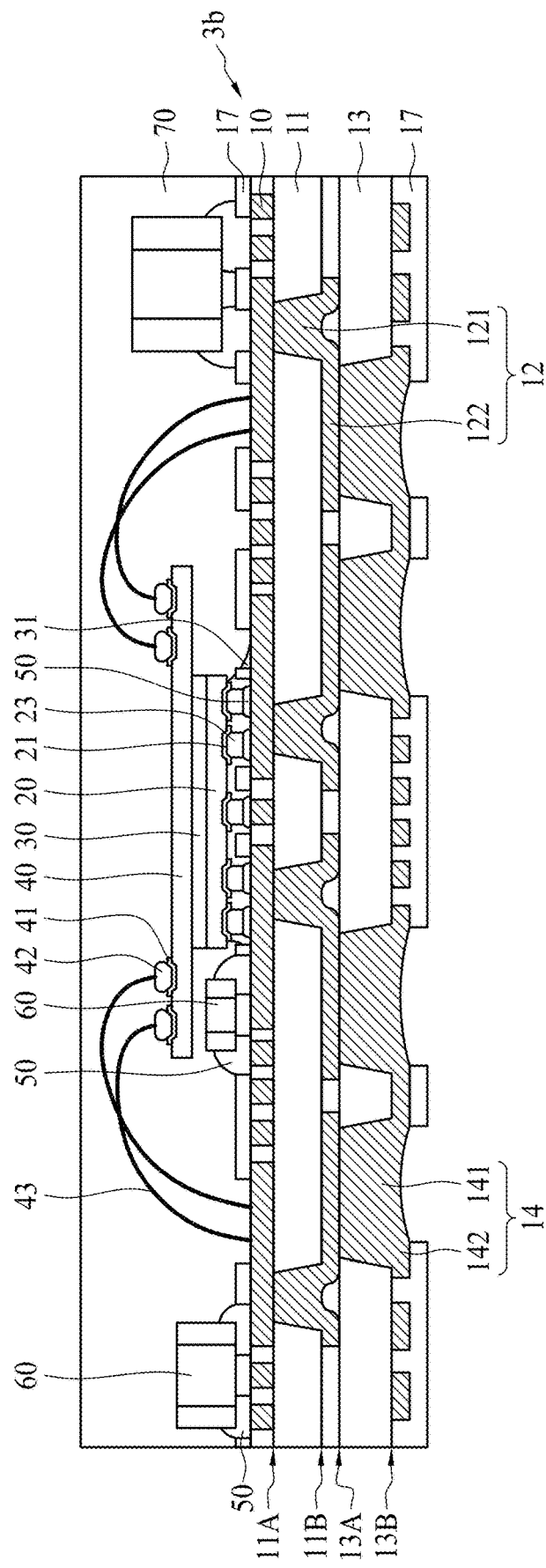
FIG. 10 is a cross-sectional view of a semiconductor package structure, in accordance with some embodiments of the present disclosure.

Referring to FIG. 10, FIG. 10 is a cross-sectional view of a semiconductor package structure, in accordance with some embodiments of the present disclosure. The semiconductor package structure includes a substrate 3b. Semiconductor devices 20, 40, 60 are formed on a substrate 3b. A package body 70 is formed to encapsulate the semiconductor devices 20, 40, 60, the bonding material 30, the protection material 31, the conductive or metal wires 43, the solder material 50 and a portion of the substrate 3b to form a semiconductor device package. One end of the metal wires 43 is connected to a connection bump 42, and the other end of the metal wires 43 is connected to a patterned conductive layer 10 of the substrate 3b. The semiconductor device 20 is connected to a first patterned conductive layer 10 through external connection pad 21 and connection bumps 23.

In FIG. 10, the substrate 3b includes a first dielectric layer 11, a second dielectric layer 13, and a patterned insulation layer 17. The first dielectric layer 11 includes a first surface 11A in proximity to the semiconductor devices 20, 40, and 60 and a second surface 11B farther from the semiconductor devices 20, 40, and 60. A conductive via 121 of the patterned conductive layer 12 extends between the first surface 11A and the second surface 11B. The conductive via 121 electrically connects the first patterned conductive layer 10 and the second patterned conductive layer 122 on the second surface 11B. In some embodiments, the second patterned conductive layer 122 includes a conductive trace and/or a conductive pad extending at the level of the second surface 11B of the first dielectric layer 11.

Still referring to FIG. 10, the substrate 3b further includes a second dielectric layer 13 in proximity to the second surface 11B. The second dielectric layer 13 includes a third surface 13A in proximity to the semiconductor devices 20, 40, and 60 and a fourth surface 13B farther from the semiconductor devices 20, 40, and 60. A conductive via 141 of the patterned conductive layer 14 extends between the third surface 13A and the fourth surface 13B. The conductive via 14 electrically connects the second patterned conductive layer 122 and the third patterned conductive layer 142 on the fourth surface 13B. The patterned insulation layer 17 includes a plurality of openings exposing the conductive via 14 in the second dielectric layer 13. As shown in FIG. 10, the conductive via 121 is offset from the conductive via 141. The conductive via 121 and the conductive via 141 can be selected from the conductive vias illustrated in FIG. 4A, FIG. 4B, FIG. 5A, and FIG. 6A.

Figure 11:
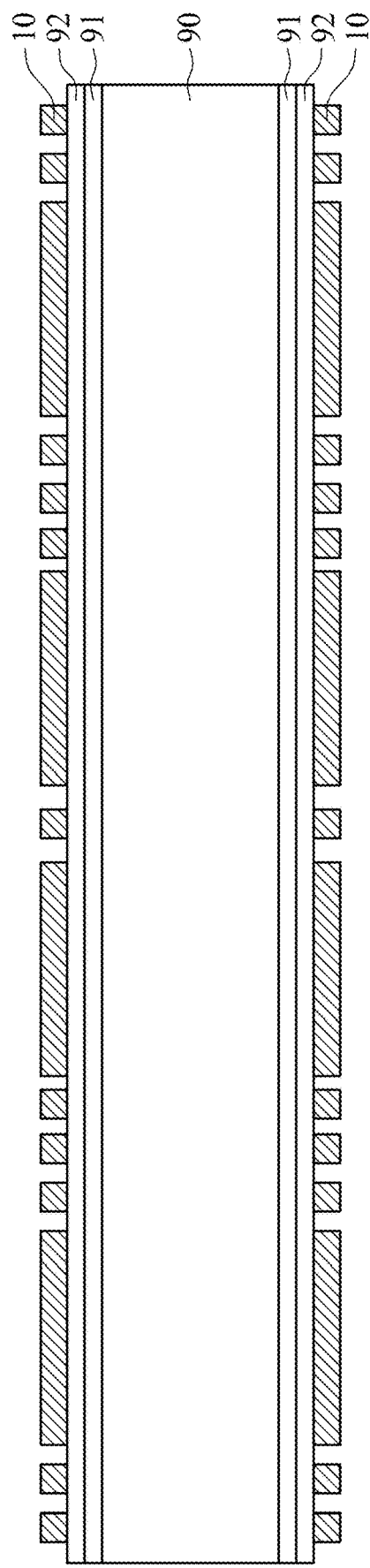
FIG. 11, FIG. 12, FIG. 13, FIG. 14, FIG. 15, FIG. 16, FIG. 17, FIG. 18, and FIG. 19 are cross-sectional views of a semiconductor substrate structure fabricated at various stages, in accordance with some embodiments of the present disclosure.

FIG. 11 to FIG. 19 are cross-sectional views of a semiconductor substrate structure fabricated at various stages, in accordance with some embodiments of the present disclosure. In FIG. 11, a carrier 90, copper foils 91, copper foils 92, and a patterned conductive layer 10 are provided. The carrier 90 may include, for example, glass-cloth/glass-fiber (e.g., pre-impregnated/pre-preg or other materials), Polypropylene (PP), FR-5 or other suitable materials. In some embodiments, an adhesive layer (not shown in FIG. 11) is formed between the copper foil 91 and the copper foil 92. The copper foil 92 has a thickness ranging from about 1 μm to about 3 μm. The copper foil 91 has a thickness ranging from about 10 μm to about 18 μm. The copper foil 91 is disposed on the carrier 90. The copper foil 92 is disposed on the copper foil 91. The patterned conductive layer 10 is disposed on the copper foil 92. The patterned conductive layer 10 may include conductive traces, pads and other circuitry elements. The patterned conductive layer 10 has a width of approximately 15 μm. The patterned conductive layer 10 has a pitch of approximately 15 μm.

Figure 12:
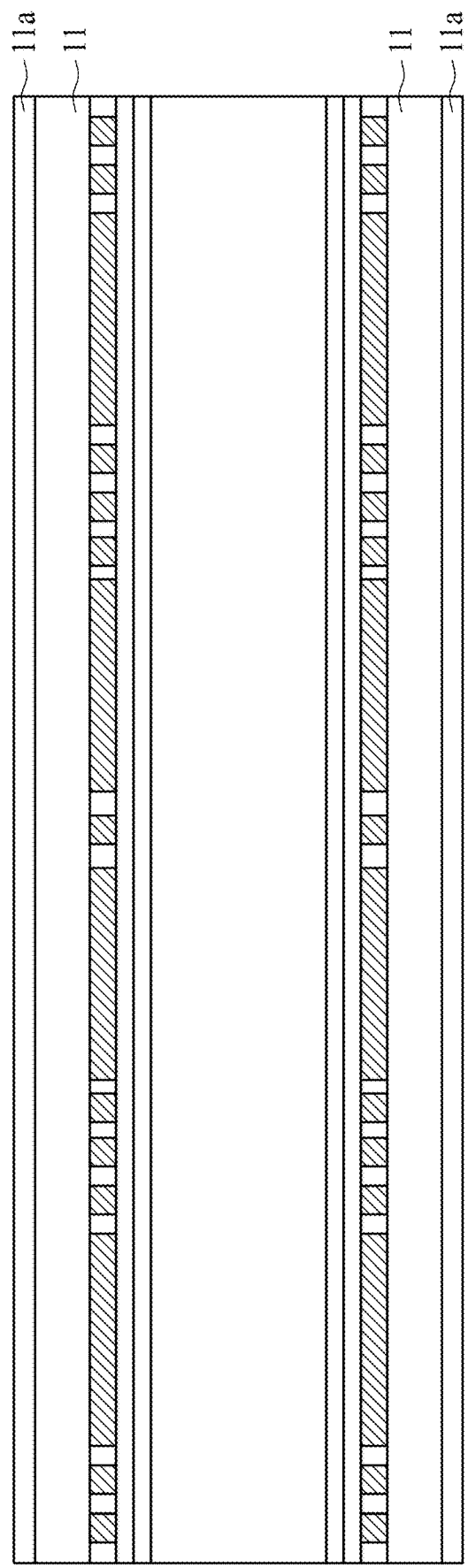

In FIG. 12, a first dielectric layer 11 or first passivation layer is laminated to the copper foil 92 to cover the patterned conductive layer 10. The dielectric layer 11 may include glass-cloth/glass-fiber (e.g., pre-impregnated/pre-preg or other materials), ABF or other materials. The first dielectric layer 11 may include carbon particles. The first dielectric layer 11 may include black particles. The first dielectric layer 11 is black. The dielectric layer 11 may absorb light. A metal layer 11a (e.g., a copper layer) is disposed on the first dielectric layer 11.

Figure 13:
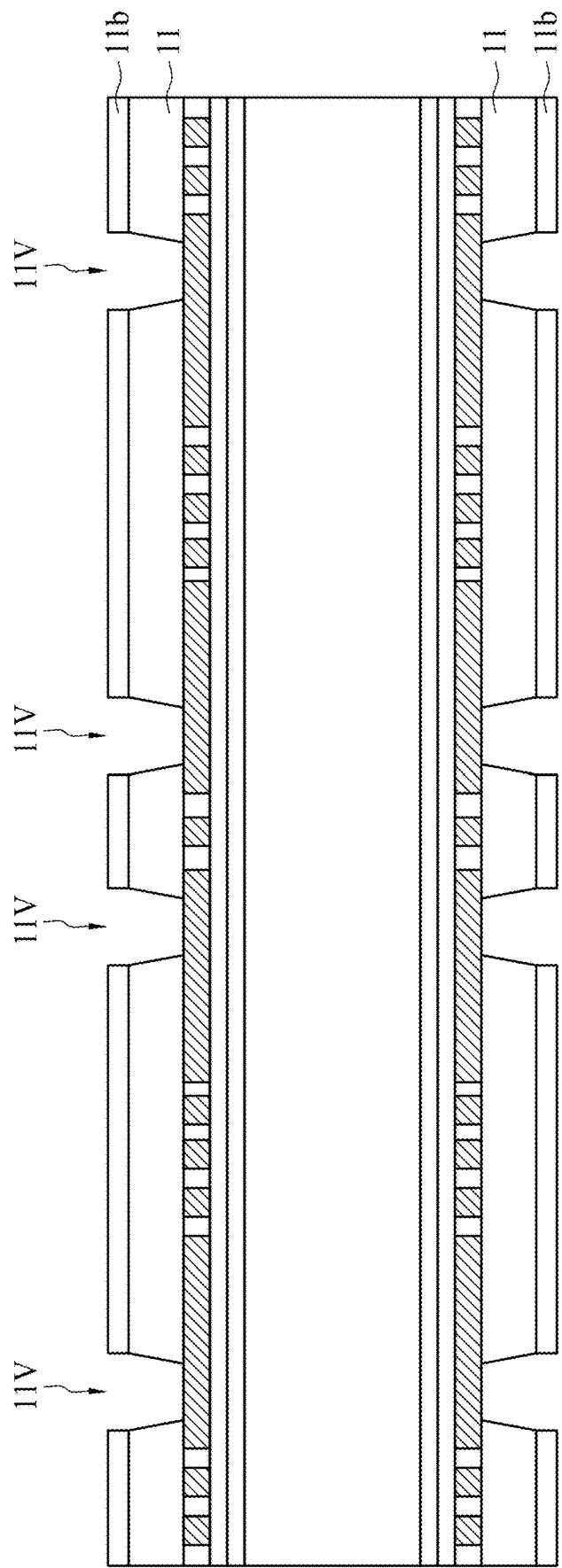

In FIG. 13, the metal layer 11a is patterned to form a patterned metal layer 11b. The patterned metal layer 11b may function as a mask. A portion of the dielectric layer 11 is removed by, for example but not limited to, laser technique to form a number of via holes 11v in the first dielectric layer 11. Each of the via holes 11v exposes the patterned conductive layer 10. In some embodiments, forming each of the via holes 11v may include following operations with reference to FIG. 3 and FIG. 4B: removing a first portion of the first dielectric layer 11 to form a first predetermined via hole 501, a second predetermined via hole 502 partially overlapping the first predetermined via hole 501, a third predetermined via hole 504 partially overlapping the second predetermined via hole 502, and a fourth predetermined via hole 503 partially overlapping the third predetermined via hole 504 and the first predetermined via hole 501, wherein each of the first, second, third, and fourth predetermined via holes 501, 502, 503, 504 includes a top opening and a bottom opening smaller than the top opening. Bottom openings of the first, the second, the third, and the fourth predetermined via holes 501, 502, 503, 504 surround a residual region 300. Subsequently, a second portion of the dielectric layer is removed to form a fifth predetermined via hole 505. The fifth predetermined via hole completely covers the residual region 300, thereby removing the residual region 300.

Figure 14:
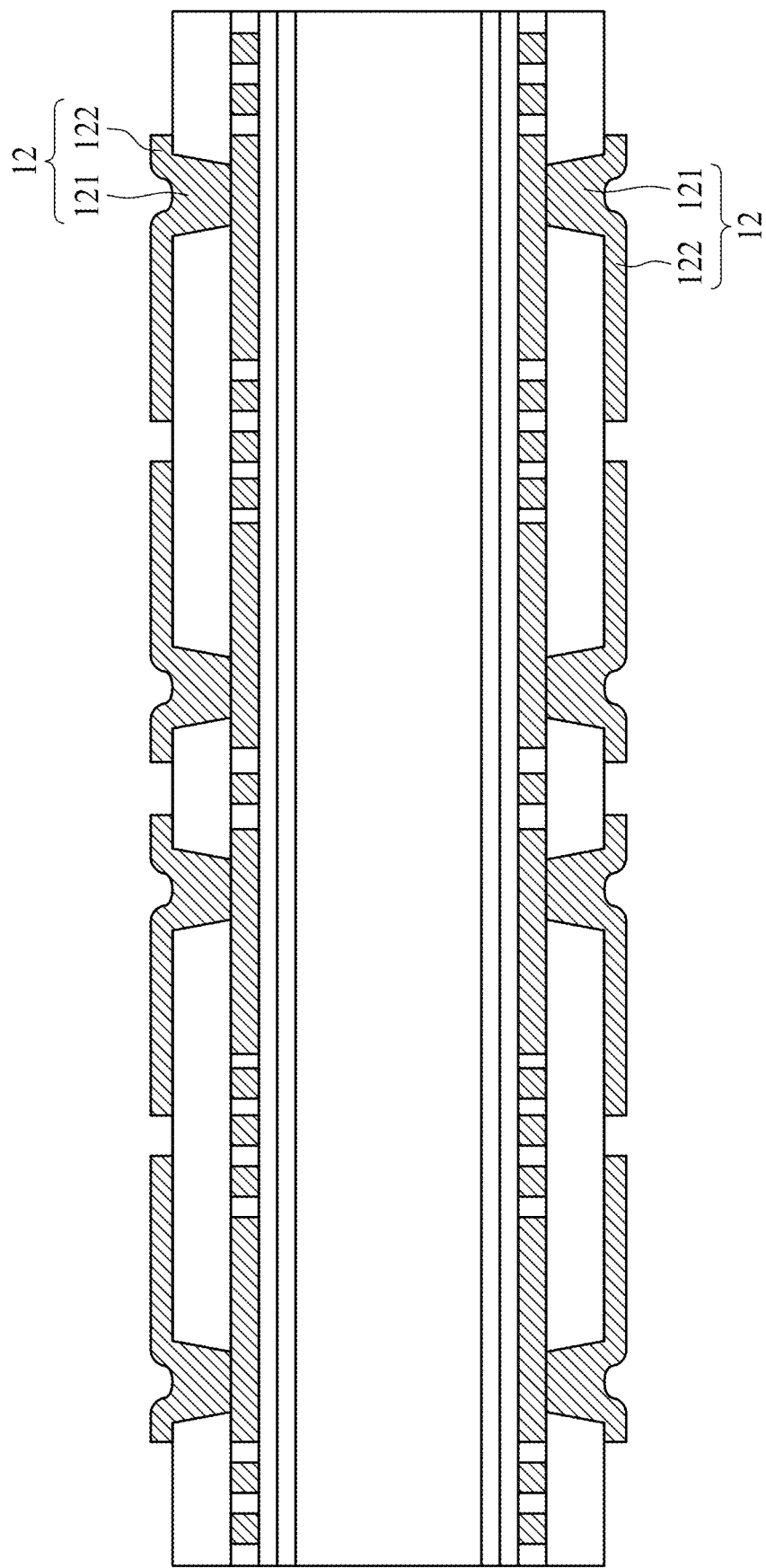

In FIG. 14, a patterned conductive layer 12 is formed. The patterned metal layer 11b is removed. The patterned conductive layer 12 is formed following a Desmear operation. The patterned conductive layer 12 is formed after a plasma clearing operation. The patterned conductive layer 12 is formed by photolithography technique and plating technique. The patterned conductive layer 12 includes conductive vias 121, conductive pads and/or conductive traces 122. The patterned conductive layer 12 may include conductive material such as copper (Cu), aluminum (Al) or other suitable material. The patterned conductive layer 12 is electrically connected to the patterned conductive layer 10.

Figure 15:
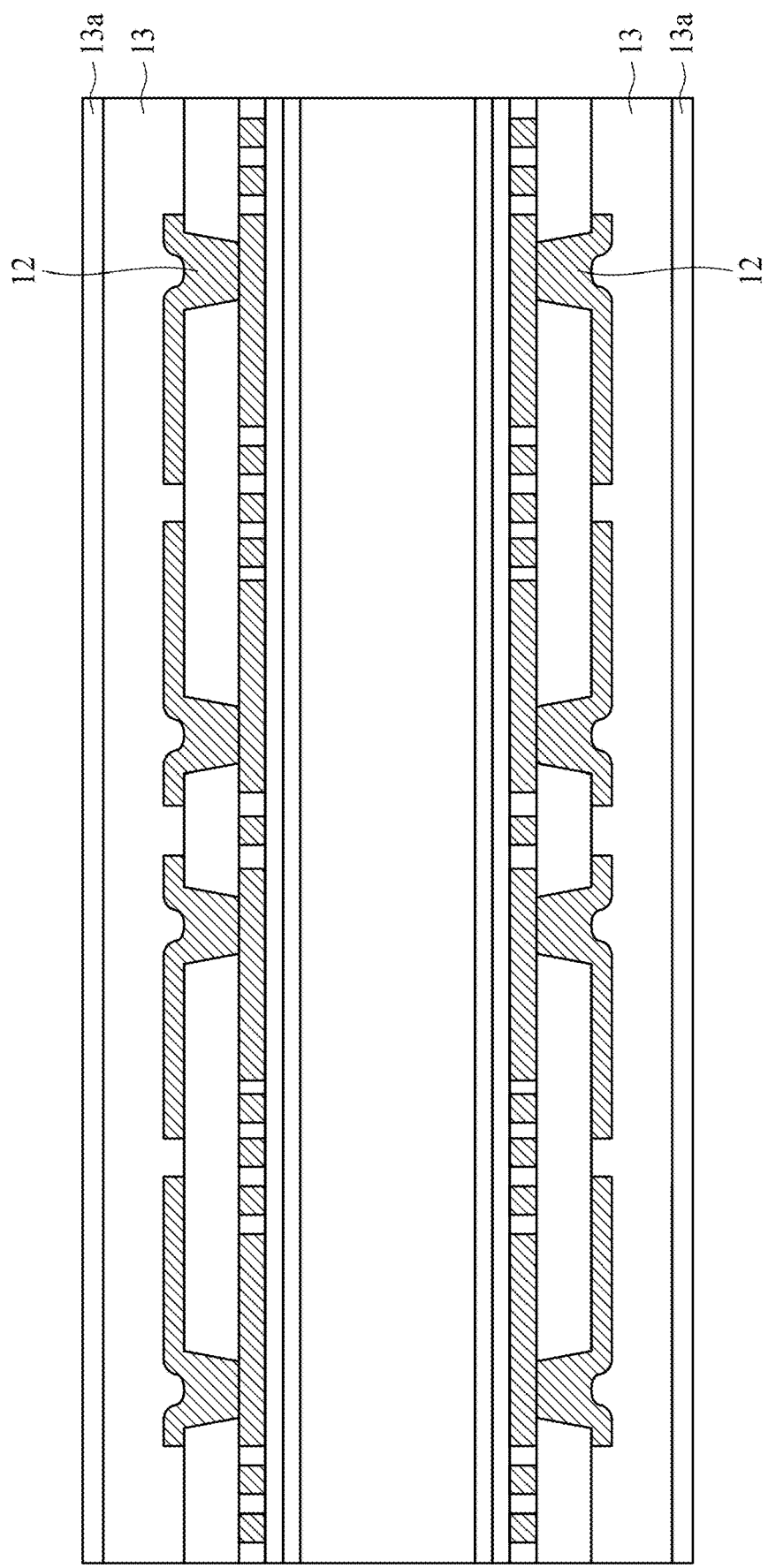

In FIG. 15, a second dielectric layer 13 or second passivation layer is laminated to the first dielectric layer 11 to cover the patterned conductive layer 12. The second dielectric layer 13 may include photosensitive material. In some embodiments, the second dielectric layer 13 may include polymer. In some embodiments, the second dielectric layer 13 may include polyamide (PI or PA) or other materials. In some embodiments, the second dielectric layer 13 may include carbon particles or black particles. In some embodiments, the second dielectric layer 13 may include glass-cloth/glass-fiber (e.g., pre-impregnated/pre-preg or other materials). In some embodiments, the second dielectric layer 13 is black. In some embodiments, the second dielectric layer 13 may absorb light. A metal layer 13a (e.g., a copper layer) is disposed on the second dielectric layer 13.

Figure 16:
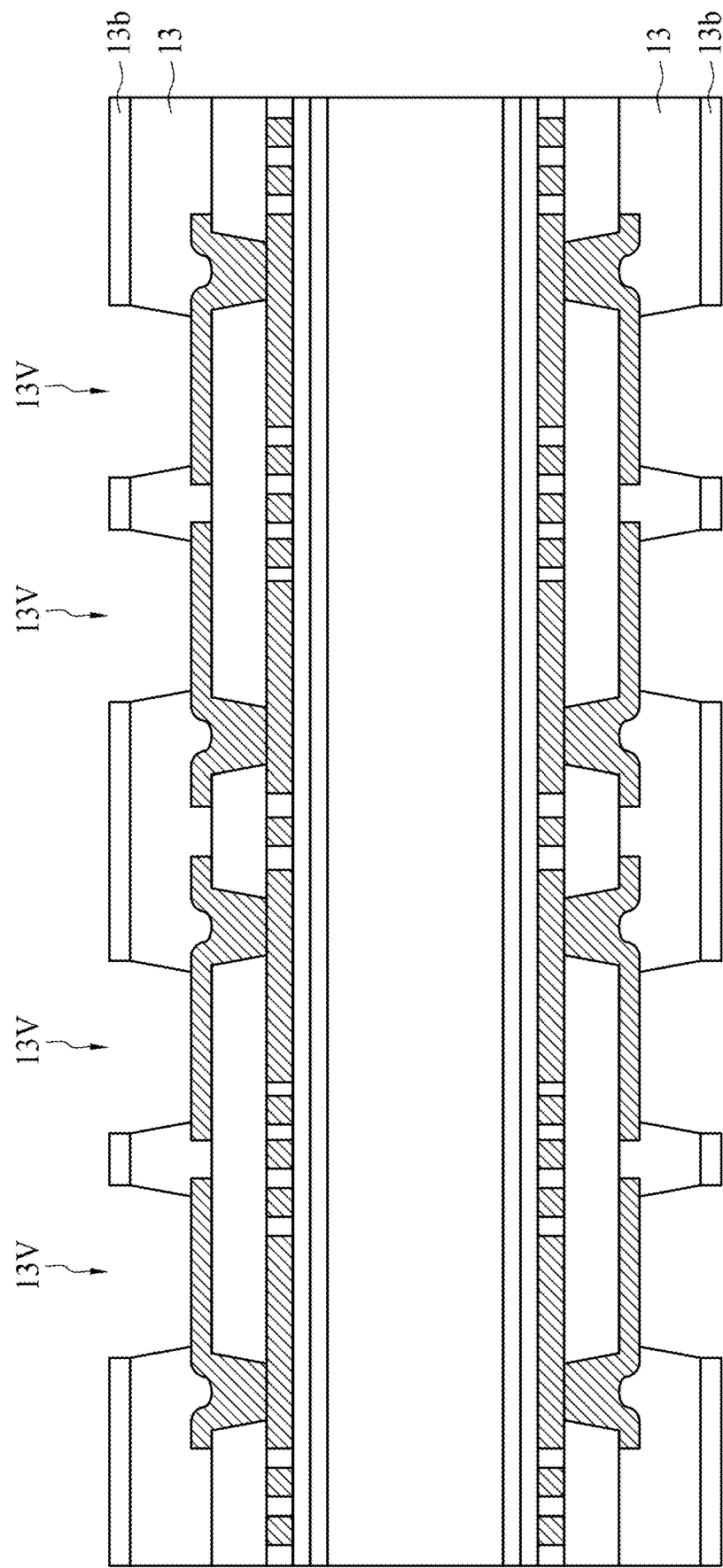

In FIG. 16, the metal layer 13a is patterned to form a patterned metal layer 13b. The patterned metal layer 13b may function as a mask. A portion of the dielectric layer 13 is removed by, for example but not limited to, laser technique to form a number of via holes 13v in the dielectric layer 13. Each of the via holes 13v exposes the conductive trace 122 portion of the patterned conductive layer 12. In other words, the via hole 13v is offset from the conductive via portion 121 of the patterned conductive layer 12.

Figure 17:
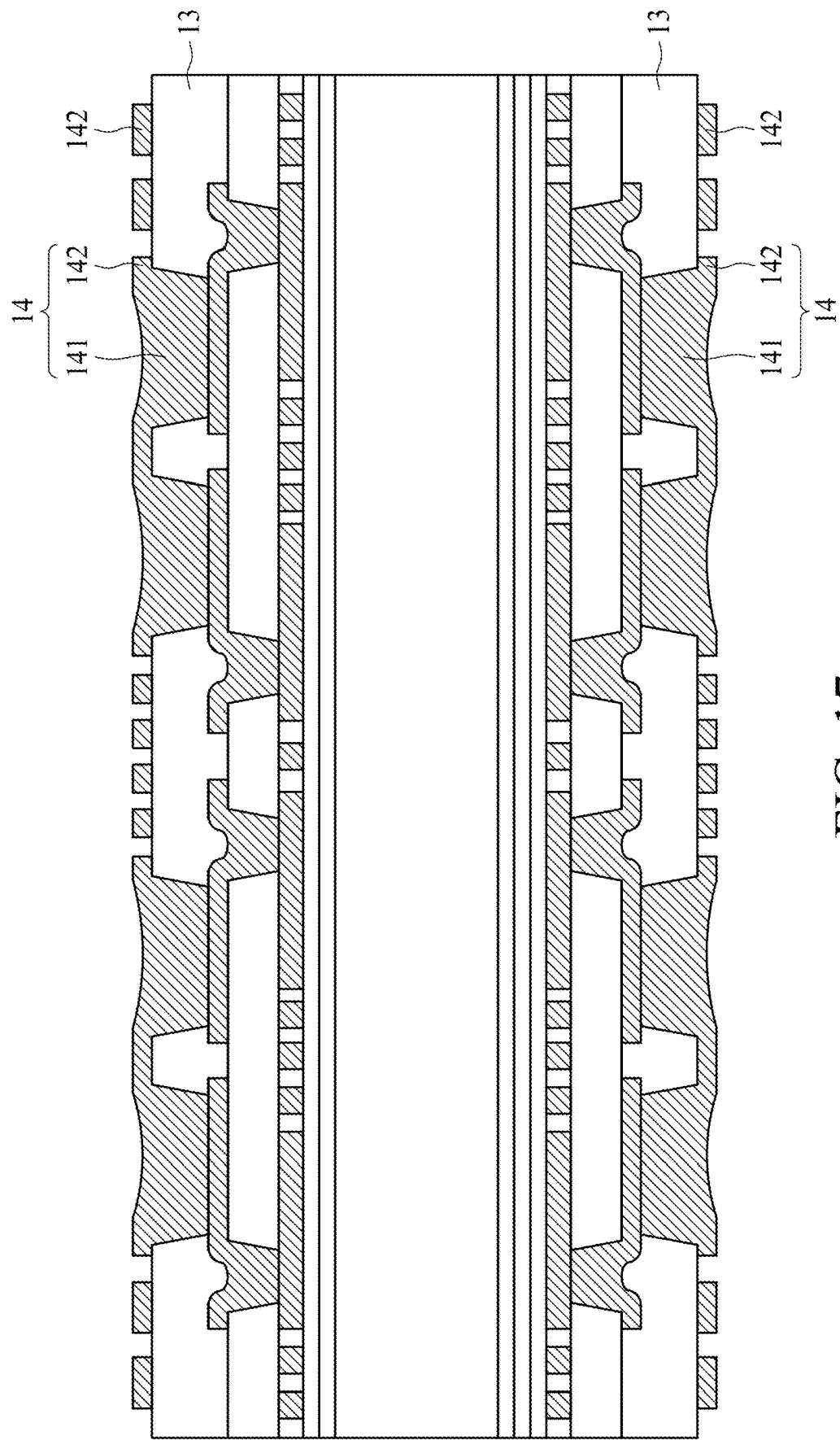

In FIG. 17, a patterned conductive layer 14 is formed. The patterned metal layer 13b is removed. The patterned conductive layer 14 is formed following a Desmear operation. The patterned conductive layer 14 is formed after a plasma clearing operation. The patterned conductive layer 14 can be formed by photolithography technique and plating technique. The patterned conductive layer 14 includes conductive vias 141, conductive pads and/or conductive traces 142. The patterned conductive layer 14 is electrically connected to the patterned conductive layer 12. The patterned conductive layer 14 may include conductive material such as copper (Cu), aluminum (Al) or other suitable material.

Figure 18:
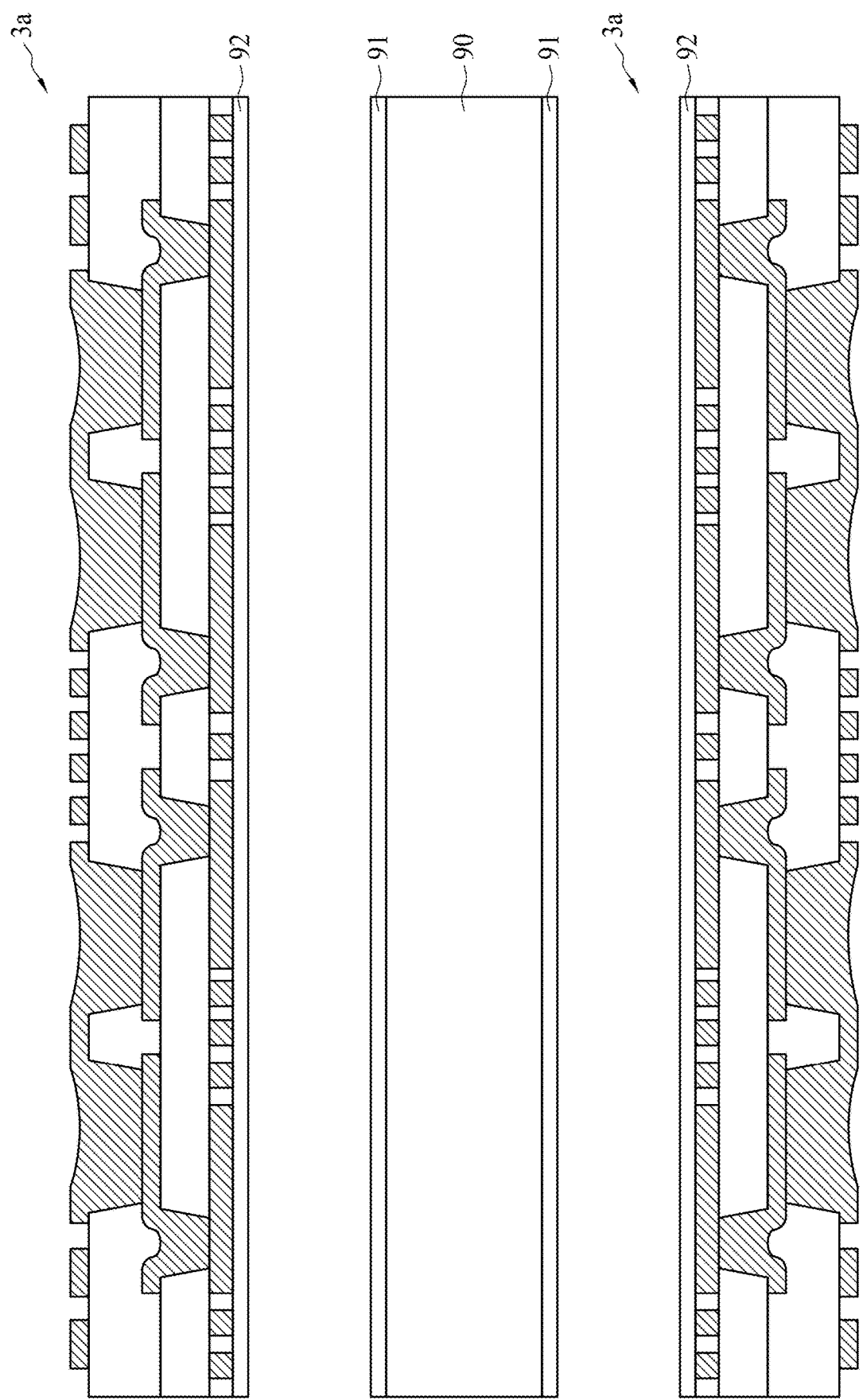

In FIG. 18, the copper foil 92 is separated from the copper foil 91 to form a substrate 3a. A substrate 3a is released or detached from the carrier 90. In FIG. 18, two substrates 3a are formed using one carrier 90 for subsequent semiconductor package structure formation.

Figure 19:
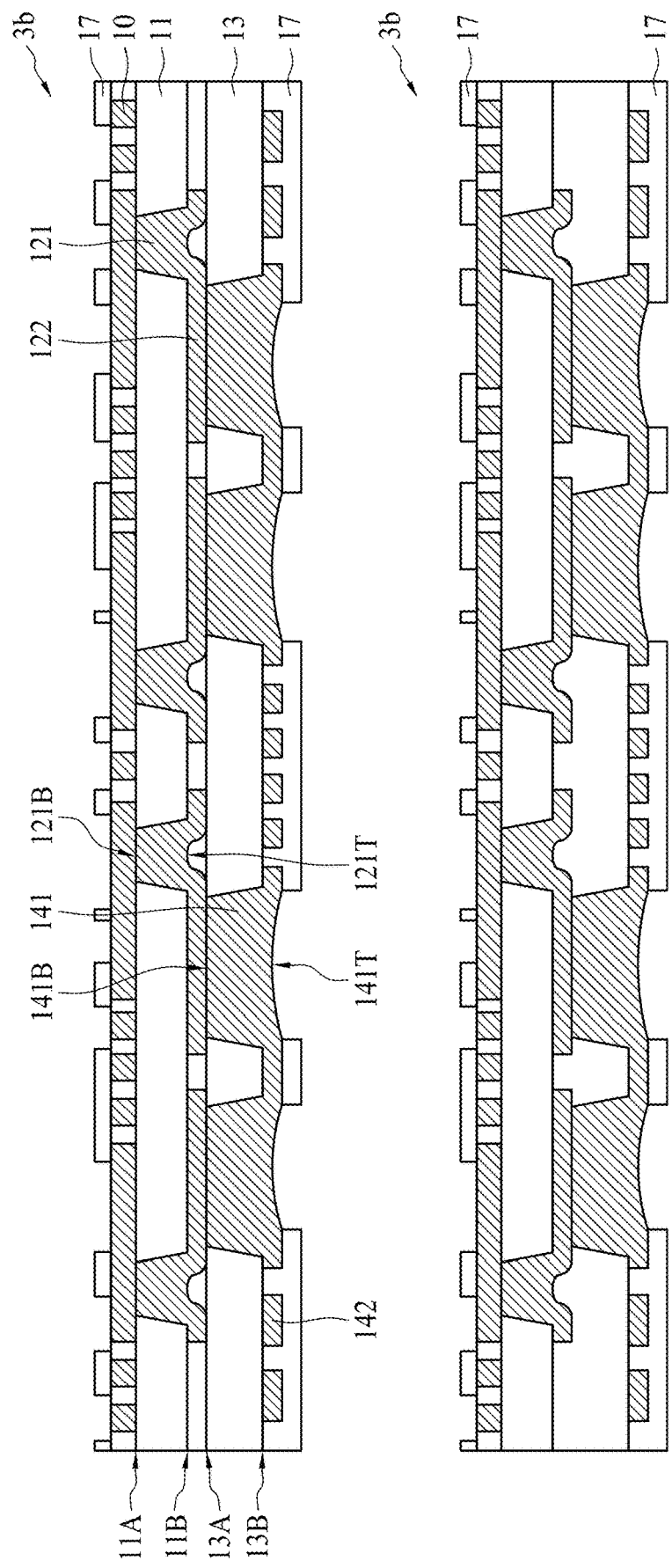

In FIG. 19, the copper foil 92 is removed by, for example, etching technique. A patterned insulation layer 17 is formed on the dielectric layer 11 to form a substrate 3b. A patterned insulation layer 17 is formed on the dielectric layer 13 to form a substrate 3b. The patterned insulation layer 17 is disposed on the first patterned conductive layer 10. The patterned insulation layer 17 is disposed on the patterned conductive layer 14. The patterned insulation layer 17 may include, but is not limited to, solder resist (SR). The patterned insulation layer 17 may include carbon particles. The patterned insulation layer 17 may include black particles. The patterned insulation layer 17 is black. The patterned insulation layer 17 may absorb light. The patterned insulation layer 17 is formed by coating technique. As described above, the first dielectric layer 11 has a first surface 11A and a second surface 11B. A bottom pattern 121B of the conductive via 121 is at the first surface 11A, and a top pattern 121T of the conductive via 121 is at the second surface 11B. Similarly, the second dielectric layer 13 has a first surface 13A and a second surface 13B. A bottom pattern 141B of the conductive via 141 is at the first surface 13A, and a top pattern 141T of the conductive via 141 is at the second surface 13B. A width of the conductive via 141 is greater than a width of the conductive via 121. In some embodiments, the conductive via 141 can have a bottom pattern shown in FIG. 6A, while the conductive via 121 can have a bottom pattern shown in FIG. 5A.

Figure 20:
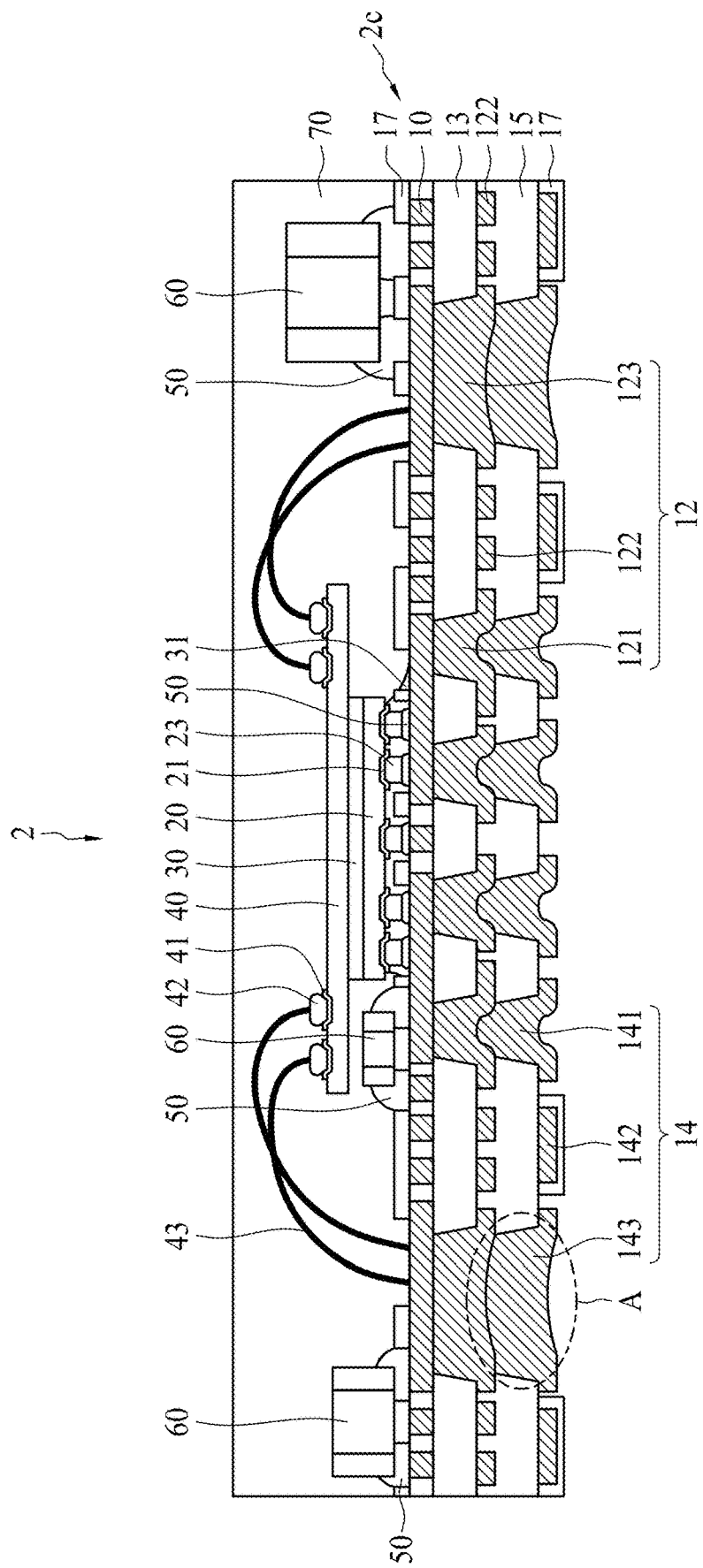
FIG. 20 is a cross-sectional view of a semiconductor package structure, in accordance with some embodiments of the present disclosure.

Referring to FIG. 20, FIG. 20 is a cross-sectional view of a semiconductor package structure, in accordance with some embodiments of the present disclosure. The semiconductor device package includes a substrate 2c, semiconductor devices (or electronic components) 20, 40, and 60, and a package body 70. The semiconductor devices 20 and 40 may include but are not limited to active devices. The semiconductor device 20 may include a flip-chip type semiconductor die 20 having external connection pads (or Under Bump Metallurgy (UBMs)) 21, connection bumps (or connection posts, pillars) 23. The semiconductor device 40 may include a wire-bond type semiconductor die 40 having external connection pads (or Under Bump Metallurgy (UBMs)) 41 and connection bumps 42. The semiconductor device 40 is disposed on the semiconductor device 20. The semiconductor device 40 is bonded or attached to the semiconductor device 20 by a bonding material 30 (e.g., an adhesive material).

The substrate 2c may include a first patterned conductive layer 10. The first patterned conductive layer 10 may include conductive traces, pads and other circuitry elements. Each of the semiconductor devices 20 is disposed on the substrate 2c. Each of the semiconductor devices 20 is electrically connected to the first patterned conductive layer 10 of the substrate 2c by a solder material 50. Each of the connection bumps 23 of each of the semiconductor devices 20 is bonded to a conductive pad of the first patterned conductive layer 10 of the substrate 2c by a solder material 50. The external connection pads 21, connection bumps 23, the solder material 50 and a portion of the patterned conductive layer 10 (or conductive pads) are surrounded or covered by a protection material 31. The protection material 31 may include resin. The protection material 31 may include particles or fillers. The protection material 31 may include underfill material.

The semiconductor device 60 may include, but is not limited to, passive devices such as resistors, capacitors, inductors or the like. Each of the semiconductor devices 60 is disposed on the substrate 2c. Each of the semiconductor devices 60 is electrically connected to the first patterned conductive layer 10 of the substrate 2c by a solder material 50. Each of the semiconductor devices 60 is bonded to a conductive pad of the first patterned conductive layer 10 of the substrate 2c by a solder material 50.

Each of the semiconductor devices 40 is disposed on the substrate 2c. Each of the semiconductor devices 40 is electrically connected to the patterned conductive layer 10 of the substrate 2c by a conductive or metal wire 43. Each of the semiconductor devices 40 is bonded to a conductive pad of the patterned conductive layer 10 of the substrate 2c by a conductive or metal wire 43.

The package body 70 may include resin. The package body 70 may include particles or fillers. The package body 70 may include mold compound. The particles or fillers of the package body 70 have an average size equal to or smaller than approximately 1 µm. The package body 70 encapsulates the semiconductor devices 20, 40, and 60, the bonding material 30, the protection material 31, the conductive or metal wires 43, the solder material 50 and a portion of the substrate 2c.

The substrate 2c includes a first dielectric layer 13 or first passivation layers. In some embodiments, the first dielectric layer 13 may include photosensitive material. In some embodiments, the dielectric layer 13 may include polymer. In some embodiments, the dielectric layer 13 may include polyamide (PI or PA) or other materials. In some embodiments, the dielectric layer 13 may include carbon particles or black particles. In some embodiments, the dielectric layer 13 may include glass-cloth/glass-fiber (e.g., pre-impregnated/pre-preg or other materials), ABF or other materials. In some embodiments, the dielectric layer 13 is black. In some embodiments, the dielectric layer 13 may absorb light.

The substrate 2c includes a patterned conductive layer 12. The patterned conductive layer 12 includes conductive vias 121, conductive pads and/or conductive traces 122, and conductive vias 123. The substrate 2c further includes a second dielectric layer 15 or second passivation layer. In some embodiments, the second dielectric layer 15 may include photosensitive material. In some embodiments, the dielectric layer 15 may include polymer. In some embodiments, the dielectric layer 15 may include polyamide (PI or PA) or other materials. In some embodiments, the dielectric layer 15 may include carbon particles or black particles. In some embodiments, the dielectric layer 15 may include glass-cloth/glass-fiber (e.g., pre-impregnated/pre-preg or other materials), ABF or other materials. In some embodiments, the dielectric layer 15 is black. In some embodiments, the dielectric layer 15 may absorb light. In some embodiments, the second dielectric layer 15 may have same material as the first dielectric layer 13. In some embodiments, the second dielectric layer 15 may have material different from the first dielectric layer 13.

The substrate 2c includes a patterned conductive layer 14. The patterned conductive layer 14 includes conductive vias 141, conductive pads and/or conductive traces 142, and conductive vias 143. The patterned conductive layers 12 and 14 are electrically connected to each other. Each of the patterned conductive layers 12 and 14 may include conductive material such as copper (Cu), aluminum (Al) or other suitable material. The substrate 2c includes a patterned insulation layer 17. The patterned insulation layer 17 may include, but is not limited to, for example, solder resist (SR). The patterned insulation layer 17 may include carbon particles. The patterned insulation layer 17 may include black particles. The patterned insulation layer 17 is black. The patterned insulation layer 17 may absorb light. The patterned insulation layer 17 is disposed on the first dielectric layer 13. The patterned insulation layer 17 is disposed on the second dielectric layer 15. The patterned insulation layer 17 is disposed on the patterned conductive layer 10. The patterned insulation layer 17 is disposed on the patterned conductive layer 14.

Each of the conductive vias 121, 123, 141 and 143 may have a width greater than approximately 90 µm. Each of the conductive vias 121, 123, 141 and 143 may facilitate heat dissipation. In some embodiments, a central axis of the conductive via 121 is aligned with a central axis of the conductive via 141. In some embodiments, a central axis of the conductive via 123 is aligned with a central axis of the conductive via 143. In some embodiments, the conductive via 121 and the conductive via 141 are coaxial. In some embodiments, the conductive via 123 and the conductive via 143 are coaxial. In some embodiments, the conductive via 121 is stacked on the conductive via 141. In some embodiments, the conductive via 123 is stacked on the conductive via 143.

Each of the conductive vias 121, 123, 141 and 143 may facilitate dissipation of heat from the semiconductor device 20 or 40, which may be high power ICs (e.g., outputting 5 W or greater). In some embodiments, the stacked or coaxial conductive vias 121, 141, 123, and 143 may reduce a heat dissipation path. In some embodiments, the stacked or coaxial conductive vias 121, 141, 123, and 143 may improve heat dissipation performance. In some embodiments, the conductive via 123 is greater in size than the conductive via 121. In some embodiments, the conductive via 143 is greater in size than the conductive via 141.

Figure 21:
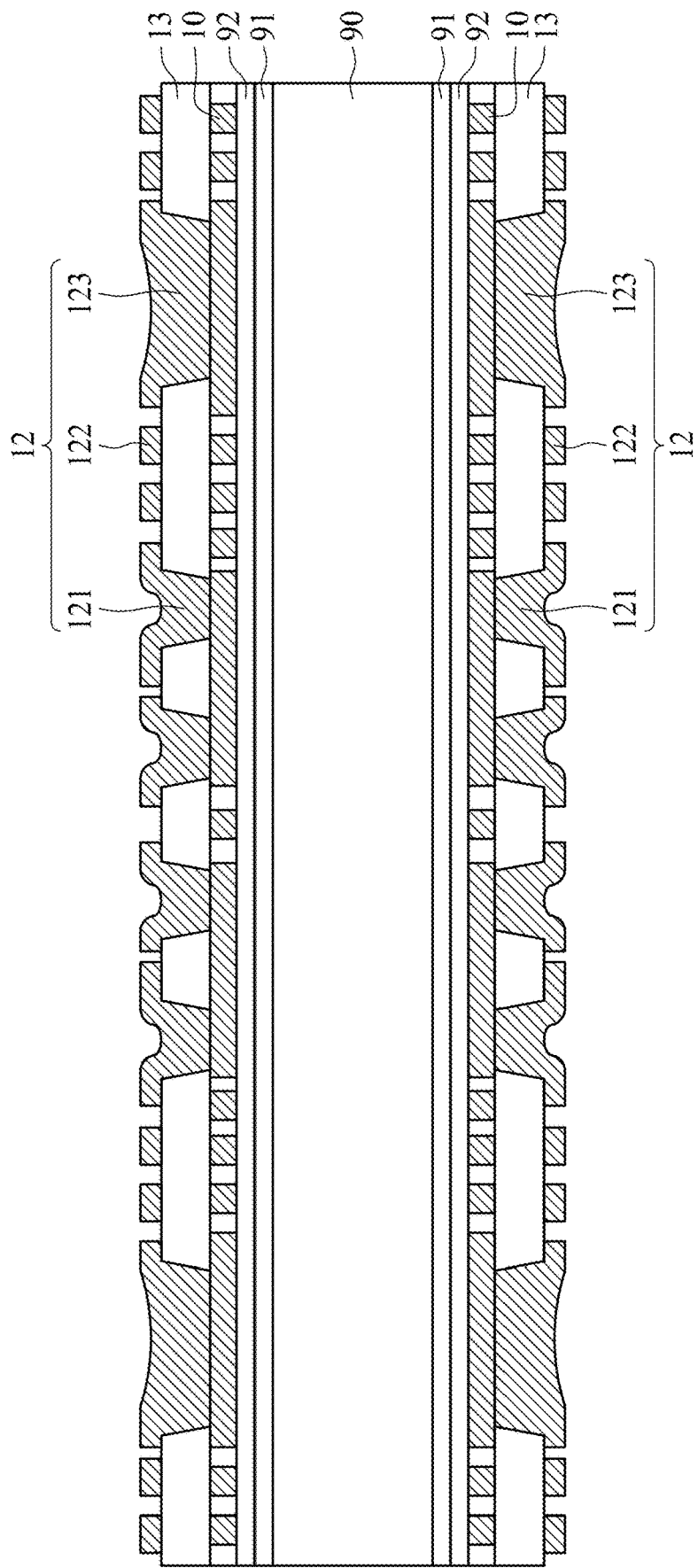
FIG. 21, FIG. 22, FIG. 23, FIG. 24, and FIG. 25 are cross-sectional views of a semiconductor substrate structure fabricated at various stages, in accordance with some embodiments of the present disclosure.

FIG. 21 to FIG. 25 are cross-sectional views of a semiconductor substrate structure fabricated at various stages, in accordance with some embodiments of the present disclosure. In FIG. 21, a carrier 90, copper foils 91, copper foils 92, and a patterned conductive layer 10 are provided. The carrier 90 may include, for example, glass-cloth/glass-fiber (e.g., pre-impregnated/pre-preg or other materials), Polypropylene (PP), FR-5 or other suitable materials. In some embodiments, an adhesive layer is formed between the copper foil 91 and the copper foil 92. The copper foil 92 has a thickness ranging from about 1 µm to about 3 µm. The copper foil 91 has a thickness ranging from about 10 µm to about 18 µm. The copper foil 91 is disposed on the carrier 90. The copper foil 92 is disposed on the copper foil 91. A patterned conductive layer 10 is disposed on the copper foil 92. The patterned conductive layer 10 may include conductive traces, pads and other circuitry elements. The patterned conductive layer 10 has a width of approximately 20 µm. The patterned conductive layer 10 has a pitch of approximately 20 µm.

Figure 22:
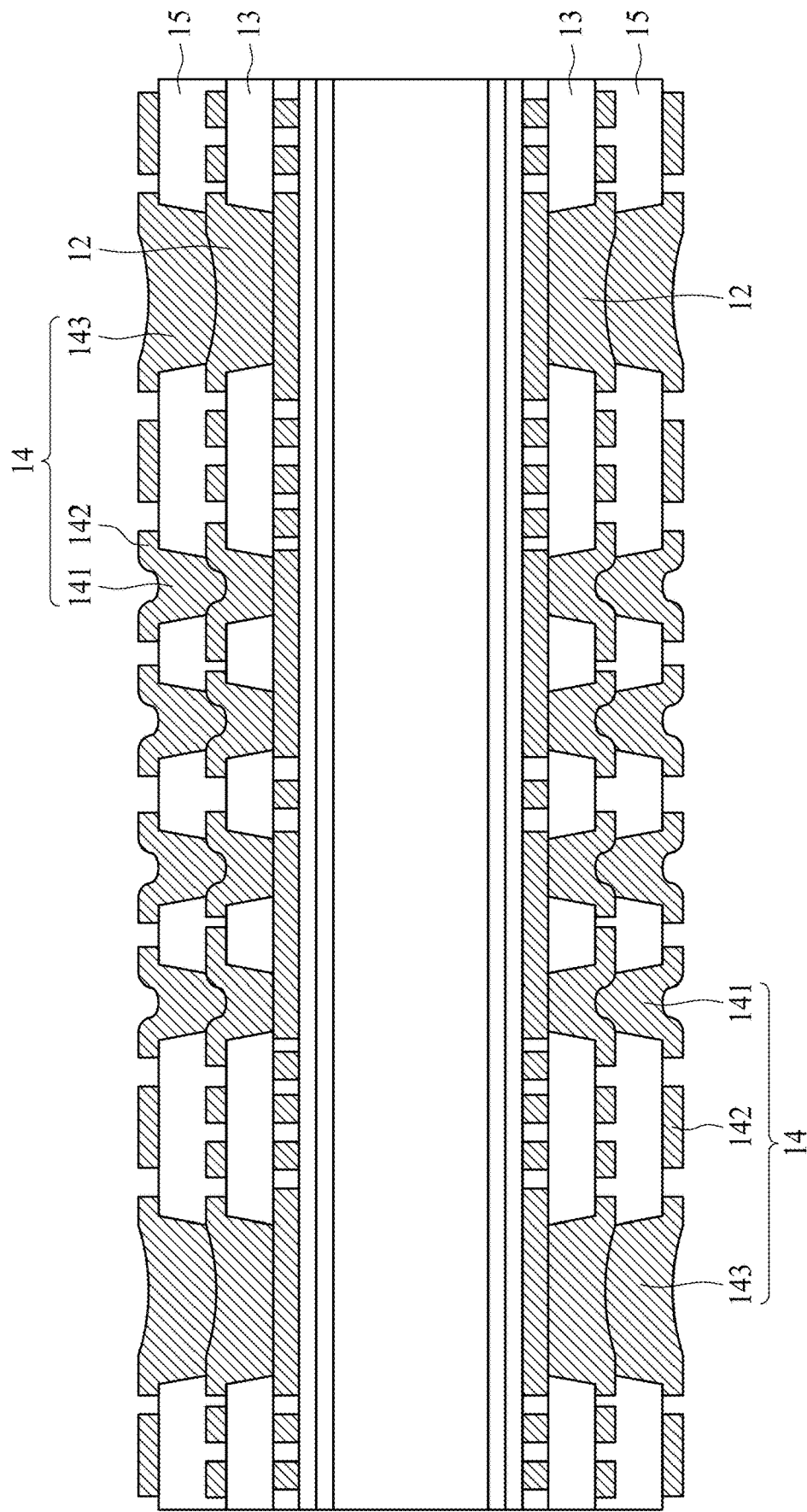

In FIG. 22, a second dielectric layer 15 or second passivation layer is formed on the first dielectric layer 13. The second dielectric layer 15 may have same material as the first dielectric layer 13. The second dielectric layer 15 may have material different from the first dielectric layer 13.

A patterned conductive layer 14 is formed on the patterned conductive layer 12. The patterned conductive layer 14 includes conductive vias 141, conductive pads 142, conductive traces 142 and conductive vias 143. The patterned conductive layer 14 is electrically connected to the patterned conductive layer 12. The patterned conductive layer 14 may include conductive material such as copper (Cu), aluminum (Al) or other suitable material.

Each of the conductive vias 121, 123, 141 and 143 may be formed of a size (e.g., a width) greater than approximately 90 µm. A central axis of the conductive via 121 is formed to be aligned with a central axis of the conductive via 141. A central axis of the conductive via 123 is formed to be aligned with a central axis of the conductive via 143. The conductive via 121 and the conductive via 141 are formed to be coaxial. The conductive via 123 and the conductive via 143 are formed to be coaxial. The conductive via 143 is formed to have a relatively greater size than the conductive via 141.

Figure 23:
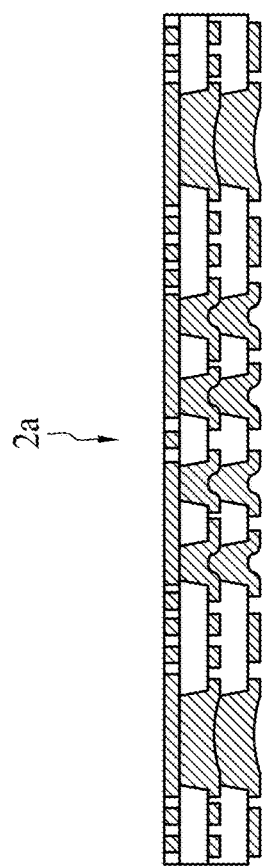
Figure 23:
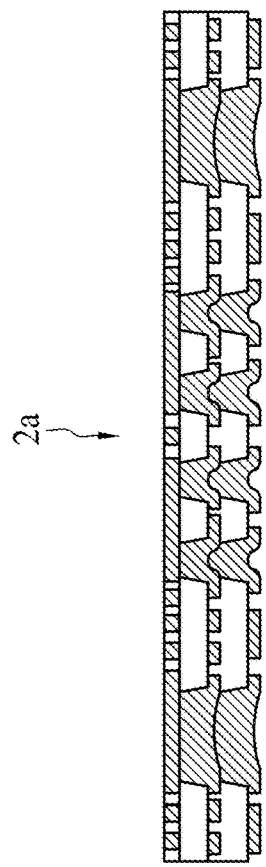

In FIG. 23, the copper foil 92 is separated from the copper foil 91 to form a substrate 2a. A substrate 2a is released or detached from the carrier 90. In FIG. 23, two substrates 2a are formed by using one carrier 90 for subsequent semiconductor package structure formation.

Figure 24:
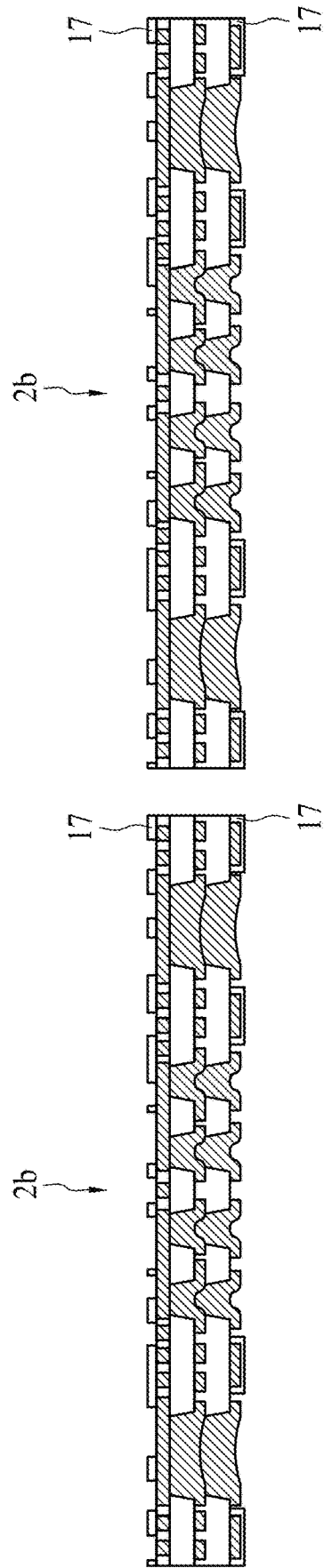

In FIG. 24, a patterned insulation layer 17 is formed on the dielectric layer 13 to form a substrate 2b. A patterned insulation layer 17 is formed on the dielectric layer 15 to form a substrate 2b. The patterned insulation layer 17 is disposed on the patterned conductive layer 10. The patterned insulation layer 17 is disposed on the patterned conductive layer 14. The patterned insulation layer 17 may include, but is not limited to, for example, solder resist (SR).

Figure 25:
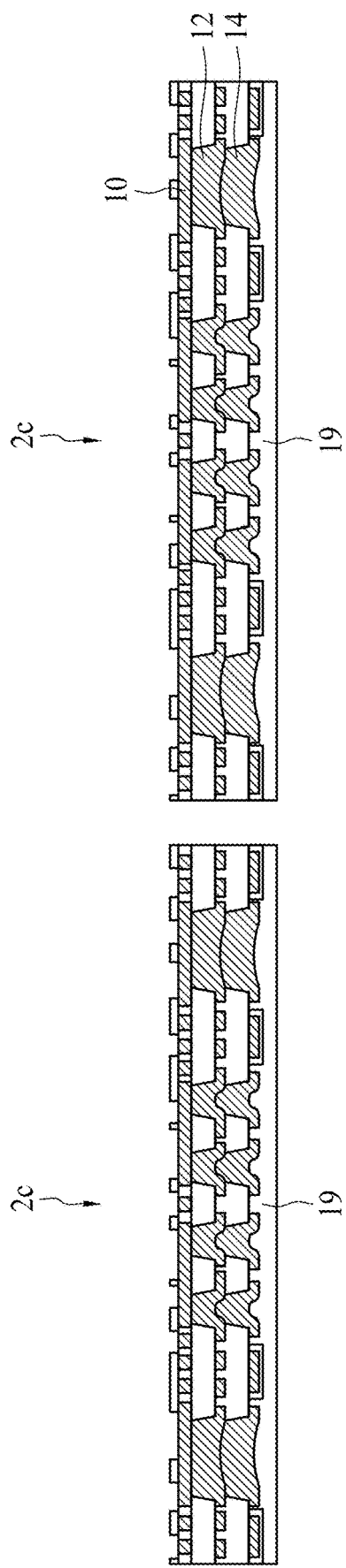

In FIG. 25, a protection film or tape 19 is formed to cover the patterned conductive layer 14. A single layer structure or multilayer structure may be formed on the patterned conductive layer 10. The single layer structure or multilayer structure may include nickel (Ni), gold (Au) or other suitable material. The protection film or tape 19 may be removed subsequent to the formation of the single layer structure or multilayer structure to form a substrate 2c.

Although it is not illustrated in FIG. 25, it should be noted that a protection film or tape 19 may be formed to cover the patterned conductive layer 10 in other embodiments of the subject application. A single layer structure or multilayer structure may be formed on the patterned conductive layer 14. The single layer structure or multilayer structure may include nickel (Ni), gold (Au) or other suitable material. The protection film or tape 19 may be removed subsequent to the formation of the single layer structure or multilayer structure to form a substrate 2c.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A substrate, comprising:
   a dielectric layer
   a first conductive via disposed in the dielectric layer, the first conductive via comprising a pattern exposed from the dielectric layer:
   wherein the pattern comprises a first geometric center corresponding to a first geometric pattern, a second geometric center corresponding to a second geometric pattern, and a first distance between the first geometric center and the second geometric center is greater than a sum of a radius of the first geometric pattern and a radius of the second geometric pattern,
   wherein the pattern further comprises a third geometric center corresponding to a third geometric pattern, a fourth geometric center corresponding to a fourth geometric pattern, and the third geometric pattern is connected to the first geometric pattern and the second geometric pattern, the fourth geometric pattern is connected to the first geometric pattern and the second geometric pattern,
   wherein a second distance between the third geometric center and the fourth geometric center is greater than a sum of a radius of the third geometric pattern and a radius of the fourth geometric pattern, and
   wherein a third distance between the third geometric center and the second geometric center is less than a fourth distance between the third geometric center and the first geometric center, and a first direction extending from the third geometric center to the second geometric center is substantially perpendicular to a second direction extending from the third geometric center to the first geometric center.

2. The substrate of claim 1, wherein a fifth distance between the fourth geometric center and the first geometric center is less than a sixth distance between the fourth geometric center and the second geometric center, and a third direction extending from the fourth geometric center to the first geometric center is substantially perpendicular to a fourth direction extending from the fourth geometric center to the second geometric center.

3. The substrate of claim 1, wherein the fourth distance between the third geometric center and the second geometric center is greater than 1.4 times of the radius of the first geometric pattern.

4. The substrate of claim 3, wherein a first imaginary line is defined between the first geometric center and the third geometric center, and a second imaginary line is defined between the first geometric center and an edge of the first geometric pattern, wherein an angle formed between the first imaginary line and the second imaginary line is less than 45 degrees.

5. The substrate of claim 1, wherein a seventh distance between a first portion of an edge of the first geometric pattern and the first geometric center is different from a eighth distance between a second portion of the edge of the first geometric pattern and the first geometric center, and wherein a ninth distance between a first portion of an edge of the fourth geometric pattern and the fourth geometric center is different from a tenth distance between a second portion of the edge of the fourth geometric pattern and the fourth geometric center.

6. The substrate of claim 1, wherein a width of the first conductive via is greater than a thickness of the first conductive via from a cross-sectional view.

7. A substrate, comprising:
   a dielectric layer, having a first surface and a second surface opposite to the first surface, the dielectric layer defining a die region and a peripheral region adjoining to the die region;
   a first conductive via located in the peripheral region and extending between the first surface and the second surface, the first conductive via comprising a first pattern;
   a second conductive via located in the die region and extending between the first surface and the second surface; and
   a third conductive via located in the peripheral region and extending between the first surface and the second surface, the third conductive via comprising a third pattern:
   wherein the first pattern comprises at least two first geometric centers corresponding to at least two first geometric patterns, respectively, and wherein the third pattern comprises at least two third geometric centers corresponding to at least two third geometric patterns, respectively, and
   wherein a first imaginary line connecting the at least two first geometric centers is non-parallel to a second imaginary line connecting the at least two third geometric centers.

8. The substrate of claim 7, wherein the first imaginary line is substantially perpendicular to the second imaginary line from a top view perspective.

9. The substrate of claim 8, wherein a length of the third conductive via is greater than a length of the first conductive via from the top view perspective.

10. The substrate of claim 7, further comprising a fourth conductive via located in the peripheral region and extending between the first surface and the second surface, the fourth conductive via being parallel to and spaced apart from the first conductive via, wherein a length of the fourth conductive via is greater than a length of the first conductive via from a top view perspective, and wherein the fourth conductive via comprises a fourth pattern; and the fourth pattern comprises at least two geometric centers corresponding to at least two fourth geometric patterns, respectively.

11. A substrate, comprising:
   a first dielectric layer, having a first surface and a second surface opposite to the first surface;
   a first conductive via extending between the first surface and the second surface of the first dielectric layer and including a first bottom surface exposed from the second surface of the first dielectric layer, the first bottom surface of the first conductive via including a first recess surface, the first recess surface including a first curved surface, the first conductive via comprising a first pattern, wherein the first pattern comprises at least two geometric centers corresponding to at least two geometric patterns, respectively;
   a second dielectric layer, having a first surface and a second surface opposite to the first surface;
   a second conductive via under the first dielectric layer and extending between the first surface and the second surface of the second dielectric layer, the second conductive via including a second top surface facing the conductive via and a second bottom surface opposite to the second top surface, the second bottom surface of the second conductive via including a second recess surface, the second recess surface including a second curved surface; and a third conductive via under the first dielectric layer and extending between the first surface and the second surface of the second dielectric layer, wherein a first portion of the second conductive via is directly connected to the third conductive via, and a second portion of the second conductive via is separated from the third conductive via through the second dielectric layer.

12. The substrate of claim 11, wherein the first portion of the second conductive via is adjacent to the second surface of the second dielectric layer and away from the first surface of the second dielectric layer.

13. The substrate of claim 11, wherein a width of the second conductive via is greater than a width of the first conductive via from a cross-sectional view, and wherein a second curvature of the second curved surface is less than a first curvature of the first curved surface.

14. The substrate of claim 13, wherein the second conductive via comprising a second pattern, and the second pattern comprises at least two geometric centers corresponding to at least two geometric patterns, respectively, and wherein a thickness of the second conductive via is substantially equal to a thickness of the first conductive via from a cross-sectional view.

\* \* \* \* \*